(12) United States Patent
Moriwaki et al.

(10) Patent No.: US 7,830,465 B2
(45) Date of Patent: Nov. 9, 2010

(54) ELECTRO-OPTICAL DEVICE AND ELECTRONIC APPARATUS

(75) Inventors: Minoru Moriwaki, Suwa-gun (JP); Tatsuya Ishii, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 86 days.

(21) Appl. No.: 12/185,195

(22) Filed: Aug. 4, 2008

(65) Prior Publication Data

US 2009/0065783 A1    Mar. 12, 2009

(30) Foreign Application Priority Data

Sep. 10, 2007    (JP)    ............... 2007-233694

(51) Int. Cl.
 *G02F 1/136*    (2006.01)
(52) U.S. Cl. .............. 349/43; 349/19; 349/33; 349/41; 349/42; 349/46
(58) Field of Classification Search ............ 349/19, 349/33, 41, 42, 43, 46
 See application file for complete search history.

(56) References Cited

U.S. PATENT DOCUMENTS 7,362,304 B2 *   4/2008   Takatori et al. ............ 345/103
2008/0197355 A1 *  8/2008  Ishii et al. .................... 257/59
2009/0080154 A1 *  3/2009  Hirabayashi et al. ........ 361/690

FOREIGN PATENT DOCUMENTS

| JP | 10-233511  | 9/1998  |
|----|------------|---------|
| JP | 2001-356709| 12/2001 |
| JP | 2003-262888| 9/2003  |
| JP | 2004-004722| 1/2004  |
| JP | 3731447    | 1/2006  |
| JP | 2007-142320| 6/2007  |

* cited by examiner

*Primary Examiner*—Jennifer Doan
(74) *Attorney, Agent, or Firm*—AdvantEdge Law Group, LLC

(57) ABSTRACT

An electro-optical device includes a semiconductor layer, a first insulating film, a second insulating film, and a gate electrode. The first insulating film is formed in an island shape so as to cover a first junction region of the semiconductor layer. The second insulating film is formed in an island shape so as to cover a second junction region of the semiconductor layer. The gate electrode faces the channel region through a gate insulating film and extends onto the first and second insulating films.

12 Claims, 15 Drawing Sheets

ELECTRO-OPTICAL DEVICE AND ELECTRONIC APPARATUS

BACKGROUND

1. Technical Field

The present invention relates to a technical field of an electro-optical device such as a liquid crystal device, a method of manufacturing the electro-optical device, and an electronic apparatus such as a liquid crystal projector provided with the electro-optical device.

2. Related Art

A liquid crystal device, which is an example of the above electro-optical device, is not only used for a direct-view-type display but also used widely, for example, as a light modulating device (light valve) of a projection-type display device. Particularly, in a projection-type display device, because intensive light emitted from a light source enters a liquid crystal light valve, a light shielding film, which serves as a light shielding device that blocks incident light, is installed in the liquid crystal light valve so that a thin film transistor (TFT) in the liquid crystal light valve does not cause an increase in leakage current and/or a malfunction, or the like, because of the intensive light.

In regard to the above light shielding device or the light shielding film, JP-A-2004-4722 describes a technology for blocking light using a scanning line, which serves as a gate electrode, in a channel region of a TFT. Japanese Patent No. 3731447 describes that light that reaches a channel region of a TFT is reduced by providing a plurality of light shielding films formed on or above the channel region and a layer that absorbs internally reflected light. JP-A-2003-262888 describes a technology for reducing incident light that enters a channel region of a TFT as much as possible while making it possible to ensure an appropriate operation of the TFT and to reduce the width of a scanning line.

However, even when light that enters a TFT is blocked by the above described light shielding film, the light shielding film is, as viewed three-dimensionally, spaced apart from a semiconductor layer that constitutes the TFT through, for example, an insulating film, and the like. Thus, there is a possibility that incident light that obliquely enters from the side of the light shielding film may reach the semiconductor layer that constitutes the TFT and, hence, light leakage current may occur in the TFT. Because of the above light leakage current in the TFT, there has been a technical problem that display defects, such as flicker or pixel chrominance non-uniformity, may occur and, as a result, the display image quality may decrease.

SUMMARY

An advantage of some aspects of the invention is that, for example, in an electro-optical device, such as an active matrix addressing liquid crystal device, it provides an electro-optical device that is able to display a high-quality image while making it possible to reduce the occurrence of light leakage current in a pixel switching TFT, a method of manufacturing the electro-optical device, and an electronic apparatus that is provided with the electro-optical device.

An aspect of the invention provides an electro-optical device. The electro-optical device includes a substrate, a data line, a scanning line, a pixel electrode, a semiconductor layer, a first insulating film, a second insulating film, and a gate electrode. The data line and the scanning line extend to intersect with each other on the substrate. The pixel electrode is provided for each pixel that is defined at a position corresponding to an intersection at which the data line and the scanning line intersect with each other. The semiconductor layer includes a channel region, a data line side source/drain region, a pixel electrode side source/drain region, a first junction region, and a second junction region. The channel region has a channel length along a direction in which the data line or the scanning line extends. The data line side source/drain region is electrically connected to the data line. The pixel electrode side source/drain region is electrically connected to the pixel electrode. The first junction region is formed between the channel region and the data line side source/drain region. The second junction region is formed between the channel region and the pixel electrode side source/drain region. The first insulating film is formed in an island shape so as to cover the first junction region. The second insulating film is formed in an island shape so as to cover the second junction region. The gate electrode faces the channel region through the gate insulating film and extends onto the first and second insulating films.

According to an electro-optical device of the aspect of the invention, while the electro-optical device is operating, for example, supply of an image signal from the data line to the pixel electrode is controlled while a scanning signal is supplied from the scanning line, so that an image may be displayed by means of so-called active matrix addressing. Note that an image signal is supplied to the pixel electrode from a corresponding one of the data lines through the transistor at predetermined timing in such a manner that the transistor, which is a switching element electrically connected between the data line and the pixel electrode, is turned on/off in accordance with a scanning signal supplied from a corresponding one of the scanning lines. The pixel electrode is a transparent electrode that is, for example, formed of a transparent conductive material, such as indium tin oxide (ITO). The plurality of pixel electrodes are provided in a matrix in an area, which becomes a display area, on the substrate at positions corresponding to intersections of the data lines and the scanning lines.

The above described transistor is formed of the semiconductor layer that includes the channel region, the data line side source/drain region, the pixel electrode side source/drain region, the first junction region formed between the channel region and the data line side source/drain region, and the second junction region formed between the channel region and the pixel electrode side source/drain region, the gate electrode that overlaps the channel region, and the gate insulating film arranged between the semiconductor layer and the gate electrode. Note that the transistor may be a double-gate thin film transistor in which two gate electrodes hold a semiconductor layer from the upper side and lower side thereof or two gate electrodes are respectively provided for two serially connected channel regions. Furthermore, three or more gate electrodes may be provided.

Particularly, in the aspect of the invention, the first insulating film is formed in an island shape so as to cover the first junction region, and the second insulating film is formed in an island shape so as to cover the second junction region. That is, the first and second junction regions are respectively covered with the first and second insulating films on the substrate in plan view. The first and second insulating films are, for example, formed of an oxide film, such as silicon dioxide ($SiO_2$), and is formed by patterning through etching, or the like.

In addition, the gate electrode is provided so as to face the channel region of the semiconductor layer through the gate insulating film. The gate electrode is provided so as to extend onto the above first and second insulating films. That is, the portion of the gate electrode that faces the channel region is arranged through the gate insulating film, and the portion of the gate electrode that faces the first junction region and the second junction region, which are arranged adjacent to the channel region, is arranged respectively through the first insulating film and the second insulating film or arranged not only through the first insulating film and the second insulating film but also through an insulating film such as the gate insulating film. Thus, the gate electrode is locally arranged adjacent to the semiconductor layer in the channel region, and the gate electrode is arranged at positions spaced apart from the semiconductor layer in the first and second junction regions because of the presence of the first and second insulating films.

If the gate electrode is arranged adjacent to the first and second junction regions to, for example, about the thickness of the gate insulating film, this electrode portion or wiring portion undesirably serves as an electrode that applies the same electric potential as the gate voltage to the junction regions to a greater or lesser extent. That is, the junction regions also generate an unexpected variation in carrier density. This leads to the occurrence of leakage current, a variation in on/off threshold, or the like, in the thin film transistor that is originally expected to form a channel by applying the gate voltage to the channel region.

Hence, particularly in the aspect of the invention, because the first and second insulating films are provided, the gate electrode is arranged adjacent to the first or second junction region but not to an extent that the above described leakage current, a variation in on/off threshold, or the like, occurs. Thus, it is possible to effectively prevent the occurrence of malfunction in the transistor.

Furthermore, particularly in the aspect of the invention, the gate electrode is provided so as to extend onto the first and second insulating films. That is, the gate insulating film is arranged so as to overlap the first and second junction regions as viewed in plan on the substrate. Thus, it is possible to block light that would enter the first or second junction region from the upper layer side of the gate electrode. Particularly, the second junction region in the semiconductor layer tends to produce light leakage current. Thus, by blocking light that would enter the second junction region, it is possible to effectively prevent the occurrence of light leakage current.

In addition, owing to the above described high light shielding ability, it is possible to sufficiently block light without providing an additional light shielding film, or the like. Thus, an area of arrangement for the non-aperture region (that is, region through which light used for displaying an image does not pass) of each pixel increases and, hence, it is possible to prevent the aperture region other than the non-aperture region from being further reduced. As a result, even when each pixel is miniaturized, a relatively high aperture ratio may be maintained.

Thus, according to the electro-optical device of the aspect of the invention as described above, it is possible to reduce or prevent the occurrence of display defects, such as a flicker, because of the occurrence of light leakage current of the transistor in each pixel while preventing malfunction of the transistor. Thus, according to the electro-optical device of the aspect of the invention, it is possible to achieve a high-quality image display.

In the electro-optical device according to the aspect of the invention, as viewed in plan on the substrate, the first insulating film may be provided so as not to overlap at least portion of the data line side source/drain region, the second insulating film may be provided so as not to overlap at least portion of the pixel electrode side source/drain region, and the gate electrode may be extended so as to overlap at least portion of the data line side source/drain region and extended so as to overlap at least portion of the pixel electrode side source/drain region.

According to the above aspect, the first insulating film, as viewed in plan on the substrate, is provided so as not to overlap at least portion of the data line side source/drain region, and the gate electrode is extended along an outline of the first insulating film so as to overlap at least portion of the data line side source/drain region. Thus, the gate electrode, which is arranged at a position that is spaced apart from the first junction region of the semiconductor layer through the first insulating film, is arranged adjacent to the data line side source/drain region to, for example, about the thickness of the gate insulating film.

On the other hand, the second insulating film, as viewed in plan on the substrate, is provided so as not to overlap at least portion of the pixel electrode side source/drain region, and the gate electrode is extended along an outline of the second insulating film so as to overlap at least portion of the pixel electrode side source/drain region. Thus, as in the case of the above described first insulating film, the gate electrode is arranged adjacent to the pixel electrode side source/drain region to, for example, about the thickness of the gate insulating film.

Note that the data line side source/drain region and the pixel electrode side source/drain region are densely doped conductive layers. Thus, as described above, even when the gate electrode is arranged adjacent to the data line side source/drain region or the pixel electrode side source/drain region, an electric field generated at the gate electrode substantially or completely does not electrically influence the data line side source/drain region and the pixel electrode side source/drain region to cause a malfunction in the transistor in terms of practical use.

When the gate electrode is arranged adjacent to the data line side source/drain region or the pixel electrode side source/drain region, it is possible to block light that would obliquely enter, for example, the first or second junction region from the upper layer side of the data line side source/drain region or the pixel electrode side source/drain region. It is possible to further effectively reduce or prevent the occurrence of display defects, such as a flicker, due to the occurrence of light leakage current. Thus, it is possible to achieve a high-quality image display.

In the electro-optical device according to the aspect of the invention, the gate insulating film may be formed not only in the channel region but also in regions that face the first and second junction regions as a base layer for the first and second insulating films.

According to the above aspect, the gate insulating film is not only formed in the channel region but also formed in the regions that face the first and second junction regions. Then, the gate insulating film serves as a base layer for the first and second insulating films. That is, the first and second insulating films are respectively arranged in an upper layer on or above the gate insulating film.

With this configuration, the gate electrode is arranged at a position that is spaced apart from the semiconductor layer by the thickness of the first or second insulating film at positions that face the first and second junction regions. Thus, it is possible to further effectively prevent an electric field generated at the gate electrode from electrically influencing the first and second junction regions. Thus, it is possible to further reliably prevent the occurrence of malfunction in the transistor.

In the electro-optical device according to the aspect of the invention, the gate insulating film may be not formed in regions that face the first and second junction regions, and the first and second insulating films each may be thicker than the gate insulating film.

According to the above aspect, the gate insulating film is not formed in the regions that face the first and second junction regions. Thus, the first and second insulating films are arranged to face the semiconductor layer without intervening the gate insulating film.

Here, particularly, the first and second insulating films each are formed so as to be thicker than the gate insulating film. Thus, the gate electrode is arranged at a position that is spaced apart from the semiconductor layer by a difference between the thickness of the first or second insulating film and the thickness of the gate insulating film at positions that face the first and second junction regions. In other words, the gate electrode is reliably arranged at a position that is spaced apart from the semiconductor layer at the positions that face the first and second junction regions as compared with the portion that faces the channel region. Thus, it is possible to further effectively prevent an electric field generated at the gate electrode from electrically influencing the first and second junction regions. Thus, it is possible to further reliably prevent the occurrence of malfunction in the transistor.

In the electro-optical device according to the aspect of the invention, the first and second insulating films may be formed from the same film in the same layer.

According to the above aspect, because the first and second insulating films are formed from the same film in the same layer, the first and second insulating films may be formed in the same deposition process. Note that if the first and second insulating films are formed in the same deposition process, for example, the thicknesses of the films, or the like, may be different from each other. By forming the first and second insulating films in the same deposition process, it is possible to prevent a prolonged, complex, advanced manufacturing process.

In the electro-optical device according to the aspect of the invention, the first insulating film, as viewed in plan on the substrate, may be formed so as to at least partially cover the data line side source/drain region in addition to the first junction region, and the gate electrode may be extended onto the first insulating film so as to cover the data line side source/drain region.

According to the above aspect, the first insulating film, as viewed in plan on the substrate, is formed so as to at least partially cover the data line side source/drain region in addition to the first junction region. Then, the gate electrode is extended onto the first insulating film so as to cover the data line side source/drain region. That is, the gate electrode, as viewed in plan on the substrate, is arranged so as to at least partially overlap the data line side source/drain region. Thus, it is possible for the gate electrode to block light that would obliquely enter, for example, the first junction region from the upper layer side of the data line side source/drain region. It is possible to further effectively reduce or prevent the occurrence of display defects, such as a flicker, due to the occurrence of light leakage current. Thus, it is possible to achieve a high-quality image display.

In the electro-optical device according to the aspect of the invention, the second insulating film, as viewed in plan on the substrate, may be formed so as to at least partially cover the pixel electrode side source/drain region in addition to the second junction region, and the gate electrode may be extended onto the second insulating film so as to cover the pixel electrode side source/drain region.

According to the above aspect, the second insulating film, as viewed in plan on the substrate, is formed so as to at least partially cover the pixel electrode side source/drain region in addition to the second junction region. Then, the gate electrode is extended onto the second insulating film so as to cover the pixel electrode side source/drain region. That is, the gate electrode, as viewed in plan on the substrate, is arranged so as to at least partially overlap the pixel electrode side source/drain region. Thus, it is possible for the gate electrode to block light that would obliquely enter, for example, the second junction region from the upper layer side of the pixel electrode side source/drain region. It is possible to further effectively reduce or prevent the occurrence of display defects, such as a flicker, due to the occurrence of light leakage current. Thus, it is possible to achieve a high-quality image display. In addition, because light leakage current mostly tends to occur at the interface between the channel region and the second junction region, the above configuration produces improvement in light shielding property at the interface.

In the electro-optical device according to the aspect of the invention, at least one of the first and second insulating films may be arranged at a position that is spaced at a predetermined distance away from the channel region as viewed in plan on the substrate.

According to the above aspect, at least one of the first and second insulating films is arranged at a position that is spaced at a predetermined distance away from the channel region as viewed in plan on the substrate. Note that the "predetermined distance" is a distance by which the first and second insulating films do not influence the holding characteristics of the channel region. Specifically, the predetermined distance is, for example, about 0.125 μm, and manufacturing margin or patterning accuracy may be considered.

When the first and second insulating films are arranged at positions that are spaced at a predetermined distance away from the channel region, it is possible for the first and second insulating films not to influence the holding characteristics of the channel region. Thus, while the transistor is turned on, it is possible to prevent a decrease in electric current (that is, on electric current) that flows through the channel region. Hence, it is possible to display a high-quality image.

In the electro-optical device according to the aspect of the invention, at least one of the first and second insulating films may be arranged so as to face the semiconductor layer through a nitride film.

According to the above aspect, the nitride film is formed between the semiconductor layer and at least one of the first and second insulating films. The nitride film serves as a protective film, for example, when the first and second insulating films are patterned by etching, or the like. Thus, it is possible to prevent the gate insulating film or the semiconductor layer from being damaged because of excessive etching. Hence, it is possible to prevent a complex, advanced manufacturing process.

Moreover, because the nitride film has a light shielding ability, it is possible to block light that would enter the semiconductor layer. Thus, it is possible to enhance the advantageous effect that the occurrence of light leakage current in the semiconductor layer is prevented.

In the electro-optical device according to the aspect of the invention, the second junction region, as viewed in plan on the substrate, may be at least partially arranged in a crossover region at which the data line intersects with the scanning line.

According to the above aspect, the second junction region, as viewed in plan on the substrate, is at least partially arranged in the crossover region at which the scanning line intersects with the data line. Intersection of the scanning line with the data line improves light shielding ability in the crossover region. Thus, when the second junction region, at which light leakage current tends to occur, is arranged in the crossover region having a high light shielding ability, it is possible to further effectively prevent the occurrence of light leakage current. Hence, it is possible to display a high-quality image.

In the electro-optical device according to the aspect of the invention, the second junction region may be an LDD region.

According to the above aspect, the semiconductor layer has an LDD region (that is, for example, an impurity region that is formed by implanting impurities into the semiconductor layer by means of ion implantation, or the like), and is formed as an LDD thin film transistor. Note that in addition to the second junction region, the first junction region may also be an LDD region.

If light leakage current occurs in an LDD region (hereinafter, referred to as "pixel electrode side LDD region" where appropriate) formed as the second junction region, due to the characteristics of the transistor that has an LDD region, electric current (that is, off electric current) that flows through the data line side source/drain region and the pixel electrode side source/drain region increases while the transistor is turned off.

Particularly, according to the aspect of the invention, it is possible for the gate electrode to effectively block light that would enter the pixel electrode side LDD region. Thus, it is possible to effectively prevent an increase in off electric current as described above and, hence, it is possible to display a high-quality image.

Another aspect of the invention provides an electronic apparatus that is provided with the electro-optical device according to the above described aspect of the invention.

According to the electronic apparatus of the aspect of the invention, because the electronic apparatus is provided with the above described electro-optical device of the aspect of the invention (including its various aspects), it is possible to implement various electronic apparatuses that are able to perform high-quality display, such as a projection display device, a cellular phone, a personal organizer, a word processor, a viewfinder-type or a direct-view-type video tape recorder, a workstation, a video telephone, a point-of-sales terminal, or a touch panel. In addition, as the electronic apparatus according to the aspect of the invention, it is possible to, for example, implement an electrophoretic device, or the like, such as an electronic paper.

Further another aspect of the invention provides a method of manufacturing an electro-optical device. The method includes: forming a semiconductor layer that includes a channel region, a data line side source/drain region, a pixel electrode side source/drain region, a first junction region formed between the channel region and the data line side source/drain region, and a second junction region formed between the channel region and the pixel electrode side source/drain region, on a substrate; forming a gate insulating film so as to cover the semiconductor layer as viewed in plan on the substrate; patterning an insulating film that is formed so as to cover the gate insulating film as viewed in plan on the substrate to form a first insulating film that is formed in an island shape so as to cover the first junction region and to form a second insulating film that is formed in an island shape so as to cover the second junction region as viewed in plan on the substrate; forming a gate electrode so as to face the channel region through the gate insulating film and extend onto the first and second insulating films as viewed in plan on the substrate; forming a scanning line and a data line so that the scanning line and the data line extend to intersect with each other; and forming a pixel electrode for each pixel that is defined at a position corresponding to an intersection at which the scanning line intersects with the data line.

According to the method of manufacturing the electro-optical device of the aspect of the invention, the semiconductor layer that includes, on the substrate, the channel region, the data line side source/drain region, the pixel electrode side source/drain region, the first junction region formed between the channel region and the data line side source/drain region, and the second junction region formed between the channel region and the pixel electrode side source/drain region, and subsequently the gate insulating film is formed so as to cover the semiconductor layer as viewed in plan on the substrate.

Then, the insulating film is formed so as to cover the gate insulating film as viewed in plan on the substrate. The insulating film is patterned to form the first insulating film that is formed in an island shape so as to cover the first junction region and to form the second insulating film that is formed in an island shape so as to cover the second junction region as viewed in plan on the substrate. Furthermore, the gate electrode is formed so as to face the channel region through the gate insulating film and extend onto the first and second insulating films as viewed in plan on the substrate. The gate electrode is formed to effectively block light that would enter the semiconductor layer and not to electrically influence regions, other than the channel region, by forming the first and second insulating films beforehand.

Finally, the scanning line and the data line are formed so that they extend to intersect with each other, and the pixel electrode is formed for each pixel that is defined at a position corresponding to the intersection of the scanning line and the data line.

As described above, according to the method of manufacturing the electro-optical device of the aspect of the invention, it is possible to desirably manufacture the above described electro-optical device that is able to display a high-quality image.

In the method of manufacturing the electro-optical device of the aspect of the invention, the formation of the semiconductor layer may include: forming the first and second junction regions as LDD regions by implanting low-concentration ion into the semiconductor layer for which the channel region, the data line side source/drain region, the pixel electrode side source/drain region and the first and second junction regions have not yet formed; and forming the data line side source/drain region and the pixel electrode side source/drain region by implanting high-concentration ion into the semiconductor layer for which the first and second junction regions have been formed.

According to the above aspect, low-concentration ion is implanted into the semiconductor layer for which the channel region, the data line side source/drain region, the pixel electrode side source/drain region, and the first and second junction regions have not yet formed. By so doing, the first and second junction regions are formed as LDD regions. In addition, when the first and second junction regions are formed, the channel region formed between the first and second junction regions is also defined. At the time of ion implantation, for example, a mask is provided on a portion (for example, channel region) that is not made as an LDD region to block implantation of ion.

Furthermore, after the first and second junction regions are formed, high-concentration ion is implanted into the semiconductor layer. By so doing, the data line side source/drain region and the pixel electrode side source/drain region are formed. Because the data line side source/drain region and the pixel electrode side source/drain region are formed as densely doped regions, the above described low-concentration ion may be implanted or may be not implanted. Conversely, high-concentration ion is implanted into the semiconductor layer but not implanted into the channel region or the first and second junction regions. Note that the above described process is typically performed after the gate insulating film is formed.

As described above, by implanting low-concentration ion and high-concentration ion into the semiconductor layer, it is possible to further desirably form the semiconductor layer that has LDD regions.

The method of manufacturing the electro-optical device according to the aspect of the invention may further include: after the formation of the gate insulating film, forming a nitride film so as to cover the gate insulating film as viewed in plan on the substrate; and after the formation of the first and second insulating films, removing the nitride film by means of thermal phosphating.

According to the above aspect, after the gate insulating film is formed, the nitride film is formed so as to cover the gate insulating film as viewed in plan on the substrate. Thus, the above described first and second insulating films are formed in the upper layer on the nitride film. Here, the nitride film serves as a protective film, for example, when the first and second insulating films are patterned by etching, or the like. Thus, it is possible to prevent the gate insulating film or the semiconductor layer from being damaged because of excessive etching. Hence, it is possible to prevent a complex, advanced manufacturing process.

After the first and second insulating films are formed, the nitride film is removed by means of thermal phosphating. The thermal phosphating is performed using, for example, phosphoric acid of 120 degrees C. to 130 degrees C. for about 20 minutes. At this time, the first and second insulating films are, for example, formed of a material, which is not influenced by thermal phosphoric acid, such as oxide film. Thus, the nitride film is removed with thermal phosphoric acid, and the first and second insulating films are left. In this manner, by performing thermal phosphating, it is possible to further easily remove the nitride film. Note that the nitride film formed between the first and second insulating films and the gate insulating film (that is, the nitride film that is protected by the first and second insulating films and is not influenced by thermal phosphoric acid) will be left; however, because the nitride film has a light shielding ability, the nitride film may serve as a light shielding film that blocks light that would enter the semiconductor layer. Thus, it is possible to enhance the advantageous effect that the occurrence of light leakage current in the semiconductor layer is prevented.

The functions and other advantageous effects of the aspects of invention become apparent from the exemplary embodiments described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the accompanying drawings. In the following embodiments, a TFT active matrix addressing liquid crystal device, which has an installed driving circuit, is used as one example of an electro-optical device according to the aspects of the invention.

Electro-Optical Device

Figure 1:
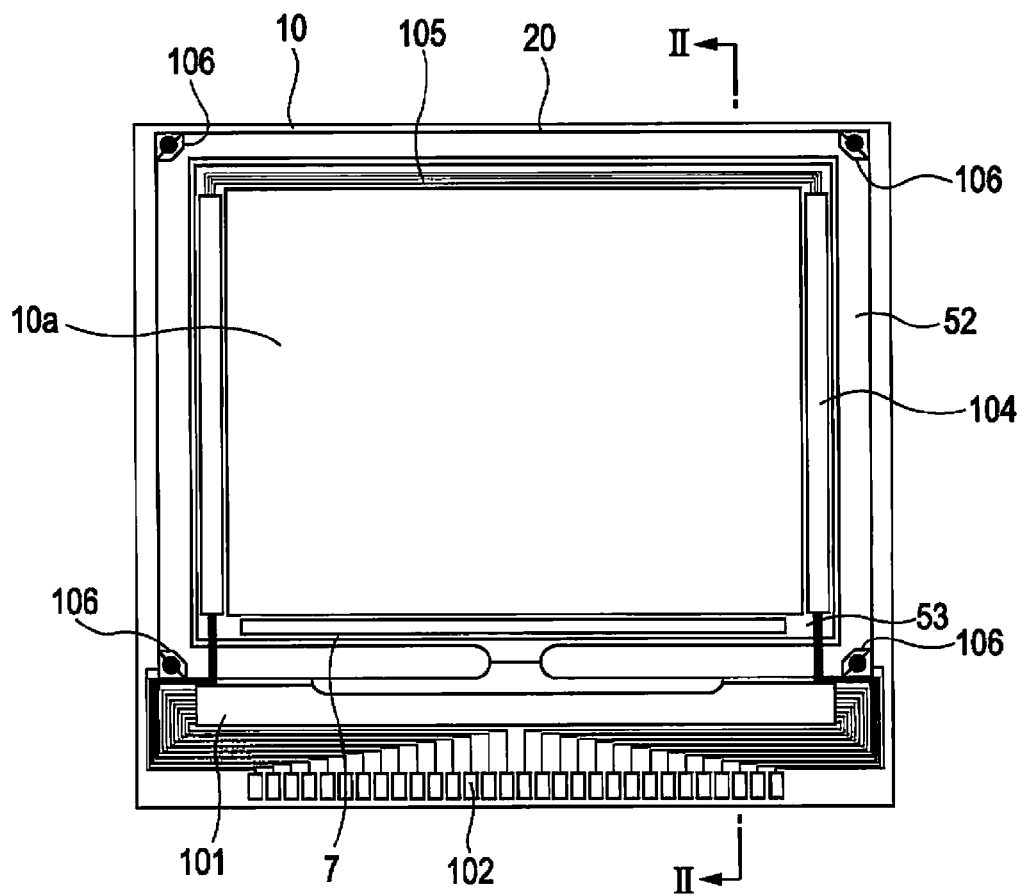
FIG. 1 is a schematic plan view of the configuration of a liquid crystal device according to an embodiment.
Figure 2:
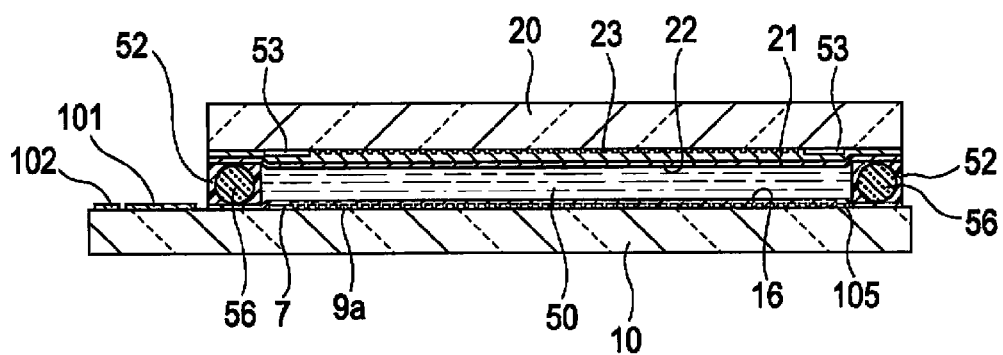
FIG. 2 is a cross-sectional view that is taken along the line II-II in FIG. 1.

The general configuration of the liquid crystal device according to the present embodiment will be described with reference to FIG. 1 and FIG. 2. FIG. 1 is a schematic plan view of the liquid crystal device, showing a TFT array substrate together with various components formed thereon, as viewed from the side of an opposite substrate. FIG. 2 is a cross-sectional view that is taken along the line II-II in FIG. 1.

In FIG. 1 and FIG. 2, the liquid crystal device according to the present embodiment is formed of a TFT array substrate 10 and an opposite substrate 20, which are opposed to each other. The TFT array substrate 10 is a transparent substrate, such as a quartz substrate, a glass substrate, or a silicon substrate, for example. The opposite substrate 20 is also a transparent substrate that is, for example, formed of the same material as that of the TFT array substrate 10. A liquid crystal layer 50 is sealed between the TFT array substrate 10 and the opposite substrate 20. The TFT array substrate 10 and the opposite substrate 20 are adhered to each other by a seal material 52, which is provided in a seal region located around an image display area 10a.

The seal material 52 is, for example, formed of an ultraviolet curing resin, a thermoset resin, or the like, for adhering both substrates. The seal material 52, after being applied on the TFT array substrate 10 in a manufacturing process, is hardened by ultraviolet irradiation, heating, or the like. In addition, for example, in the seal material 52, gap materials 56, such as glass fibers or glass beads, are dispersed in order to form a gap (inter-substrate gap), having a predetermined value, between the TFT array substrate 10 and the opposite substrate 20. The liquid crystal device according to the present embodiment is suitable for performing enlarged display with a small size used for a light valve of a projector.

In parallel to the inside of the seal region in which the seal material 52 is arranged, a window-frame-shaped light shielding film 53, having a light shielding property, that defines a window frame region of the image display area 10a is provided on the side of the opposite substrate 20. However, part or all of the window-frame-shaped light shielding film 53 may be provided on the side of the TFT array substrate 10 as an internal light shielding film.

In a peripheral region located around the image display area 10a on the TFT array substrate 10, a data line driving circuit 101, a sampling circuit 7, scanning line driving circuits 104, and an external circuit connection terminal 102 are formed.

In the peripheral region on the TFT array substrate 10 and on the outer side of the seal region, the data line driving circuit 101 and the external circuit connection terminal 102 are provided along one side of the TFT array substrate 10. In addition, in a region located inside the seal region within the peripheral region on the TFT array substrate 10, the sampling circuit 7 is arranged along one side of the image display area 10a and along one side of the TFT array substrate 10 so as to be covered with the window-frame-shaped light shielding film 53.

The scanning line driving circuits 104 are provided along two sides, adjacent to one side, of the TFT array substrate 10 so as to be covered with the window-frame-shaped light shielding film 53. Moreover, in order to electrically connect the two scanning line driving circuits 104 provided on both sides of the image display area 10a, a plurality of wirings 105 are provided along the remaining one side of the TFT array substrate 10 so as to be covered with the window-frame-shaped light shielding film 53.

Furthermore, in the peripheral region on the TFT array substrate 10, conductive terminals 106 are arranged at regions that are opposed to four corner portions of the opposite substrate 20, and conductive materials are provided between the TFT array substrate 10 and the opposite substrate 20 at positions corresponding to the conductive terminals 106 and electrically connected to the terminals 106.

In FIG. 2, a laminated structure in which pixel switching TFTs, which serve as driving elements, and wirings, such as scanning lines, data lines, and the like, are formed on the TFT array substrate 10. In the image display area 10a, pixel electrodes 9a are provided in a matrix in the upper layer on the pixel switching TFTs and the wirings, such as the scanning lines and the data lines. An alignment layer 16 is formed on the pixel electrodes 9a. Note that, in the present embodiment, each of the pixel switching elements may be various types of transistors, a TFD (Thin Film Diode), or the like, other than the TFT.

On the other hand, a light shielding film 23 is formed on a face of the opposite substrate 20, opposite the TFT array substrate 10. The light shielding film 23 is, for example, formed of a light shielding metal film, or the like, and is patterned, for example, in a grid, or the like, in the image display area 10a on the opposite substrate 20. Then, an opposite electrode 21, which is formed of a transparent material, such as ITO, is formed, for example, in a solid manner on the light shielding film 23 (on the lower side of the light shielding film 23 in FIG. 2) so as to be opposed to the plurality of pixel electrodes 9a. Further, an alignment layer 22 is formed on the opposite electrode 21 (on the lower side of the opposite electrode 21 in FIG. 2).

The liquid crystal layer 50 is, for example, formed of liquid crystal that is mixed with a single or multiple types of nematic liquid crystal. The liquid crystal layer 50 is made into a predetermined aligned state between a pair of these alignment layers. Then, when the liquid crystal device is being driven, liquid crystal holding capacitors are formed between the pixel electrodes 9a and the opposite electrode 21 by being applied with voltage, respectively.

Although not described in the drawing, in addition to the data line driving circuit 101 and the scanning line driving circuits 104, a pre-charge circuit that separately supplies pre-charge signals of predetermined voltage levels to the plurality of data lines in advance of image signals, a check circuit for checking quality, defects, or the like, of the liquid crystal device during manufacturing or upon shipment, or the like, may be formed on the TFT array substrate 10.

Figure 3:
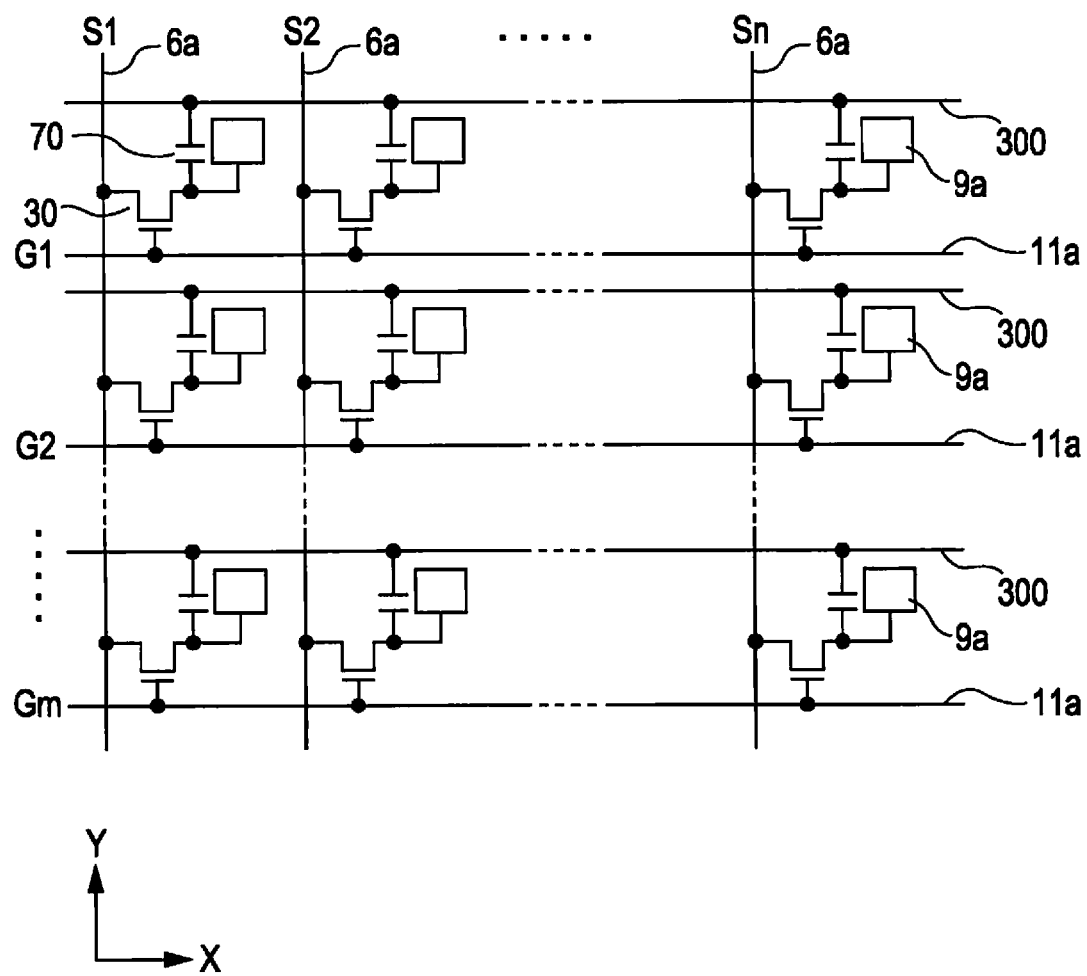
FIG. 3 is an equivalent circuit diagram of various elements, wirings, and the like, in a plurality of pixels that are formed in a matrix and that constitute an image display area of the liquid crystal device according to the embodiment.

The electrical configuration of pixel portions of the liquid crystal device according to the present embodiment will be described with reference to FIG. 3. FIG. 3 is an equivalent circuit diagram of various elements, wirings, and the like, in a plurality of pixels that are formed in a matrix and that constitute an image display area of the liquid crystal device according to the present embodiment.

In FIG. 3, the pixel electrodes 9a and TFTs 30 are formed in each of a plurality of pixels, which are formed in a matrix and constitute the image display area 10a. Each of the TFTs 30 is electrically connected to a corresponding one of the pixel electrodes 9a, and controls switching of the pixel electrode 9a while the liquid crystal device is operating. Each of the data lines 6a, which are supplied with image signals, is electrically connected to the source of the corresponding TFT 30. The image signals S1, S2, . . . , Sn to be written to the data lines 6a may be supplied in line sequential in this order or may be supplied to the plurality of adjacent data lines 6a in units of group.

Each of the scanning lines 11a is electrically connected to the gate of the corresponding TFT 30. The liquid crystal device according to the present embodiment is configured to apply scanning signals G1, G2, . . . , Gm in line sequential in this order at predetermined timing to the scanning lines 11a in the form of pulse. Each of the pixel electrodes 9a is electrically connected to the drain of the corresponding TFT 30. By turning off the TFT 30, which serves as a switching element, only during a certain period, the image signals S1, S2, . . . , Sn supplied from the data lines 6a are written to the corresponding pixel electrodes 9a at predetermined timing. The image signals S1, S2, . . . , Sn of predetermined levels, written through the pixel electrodes 9a to liquid crystal, which is one example of an electro-optical material, are held between the pixel electrodes 9a and the opposite electrode 21, which is formed on the opposite substrate 20, during a certain period of time.

Liquid crystal that constitutes the liquid crystal layer 50 (see FIG. 2) modulates light to enable gray shade as alignment and/or order of molecular association is varied by an applied voltage level. In the case of a normally white mode, a transmittance ratio to incident light is reduced in accordance with an applied voltage in each pixel. In the case of a normally black mode, a transmittance ratio to incident light is increased in accordance with an applied voltage in each pixel. As a whole, light having a contrast corresponding to image signals is emitted from the liquid crystal device.

Here, in order to prevent the leakage of image signals being held, storage capacitors 70 are added so as to be electrically in parallel with the liquid crystal capacitors that are formed between the corresponding pixel electrodes 9a and the opposite electrode 21 (see FIG. 2). Each of the storage capacitors 70 is a capacitive element that functions as a holding capacitor that temporarily holds an electric potential of the corresponding pixel electrode 9a in accordance with supply of an image signal. One of electrodes of the storage capacitor 70 is electrically in parallel with the pixel electrode 9a and is connected to the drain of the TFT 30, and the other electrode is connected to a capacitor line 300 having a fixed electric potential so as to be applied with a constant electric potential. Owing to the storage capacitor 70, electric potential holding characteristic is improved in the pixel electrode 9a, and it is possible to improve contrast and to improve display characteristics, such as a reduction in flicker. Note that the storage capacitor 70, as will be described later, also functions as an internal light shielding film that blocks light entering the TFT 30.

Figure 4:
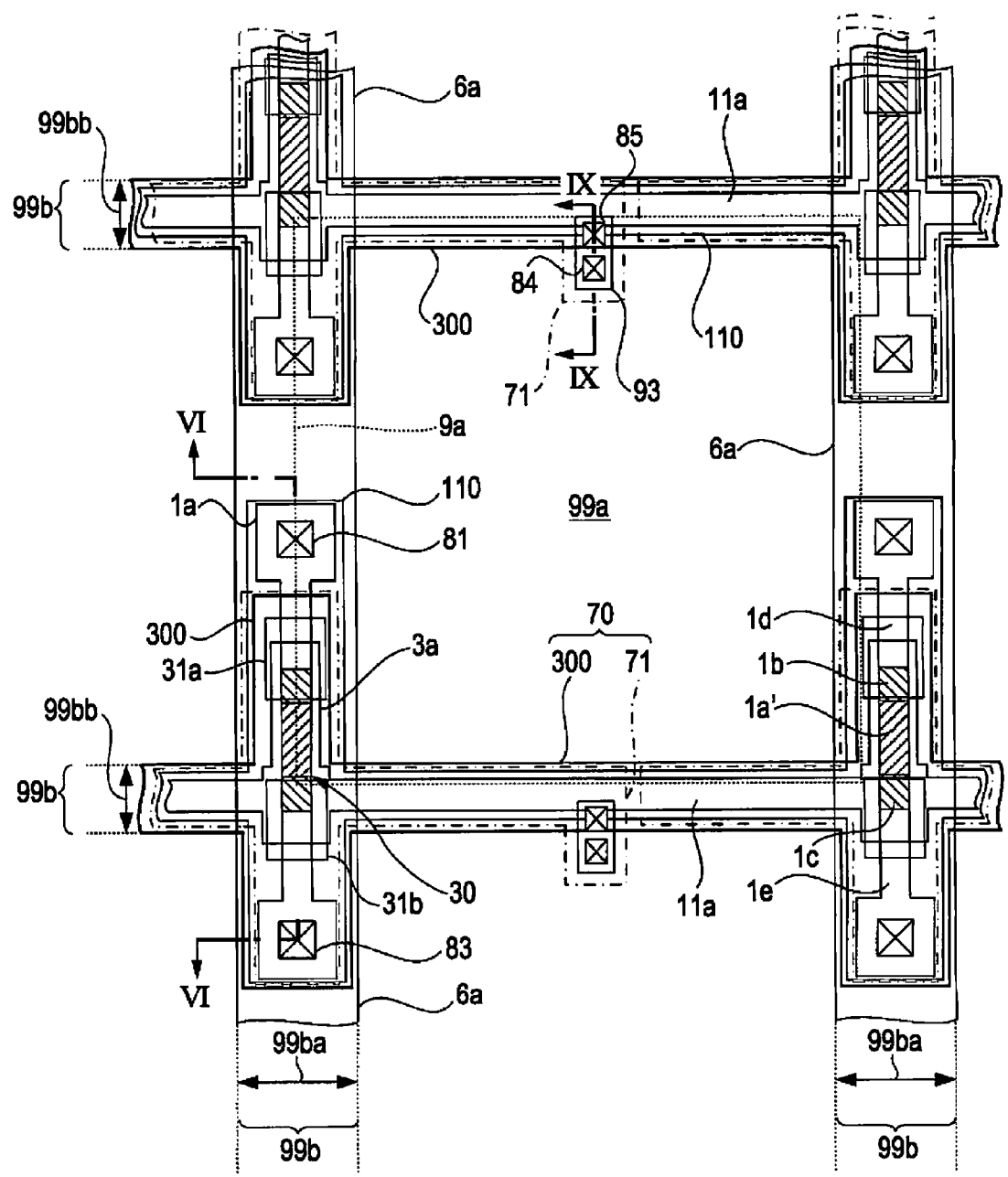
FIG. 4 is a plan view of a plurality of adjacent pixel portions.
Figure 5:
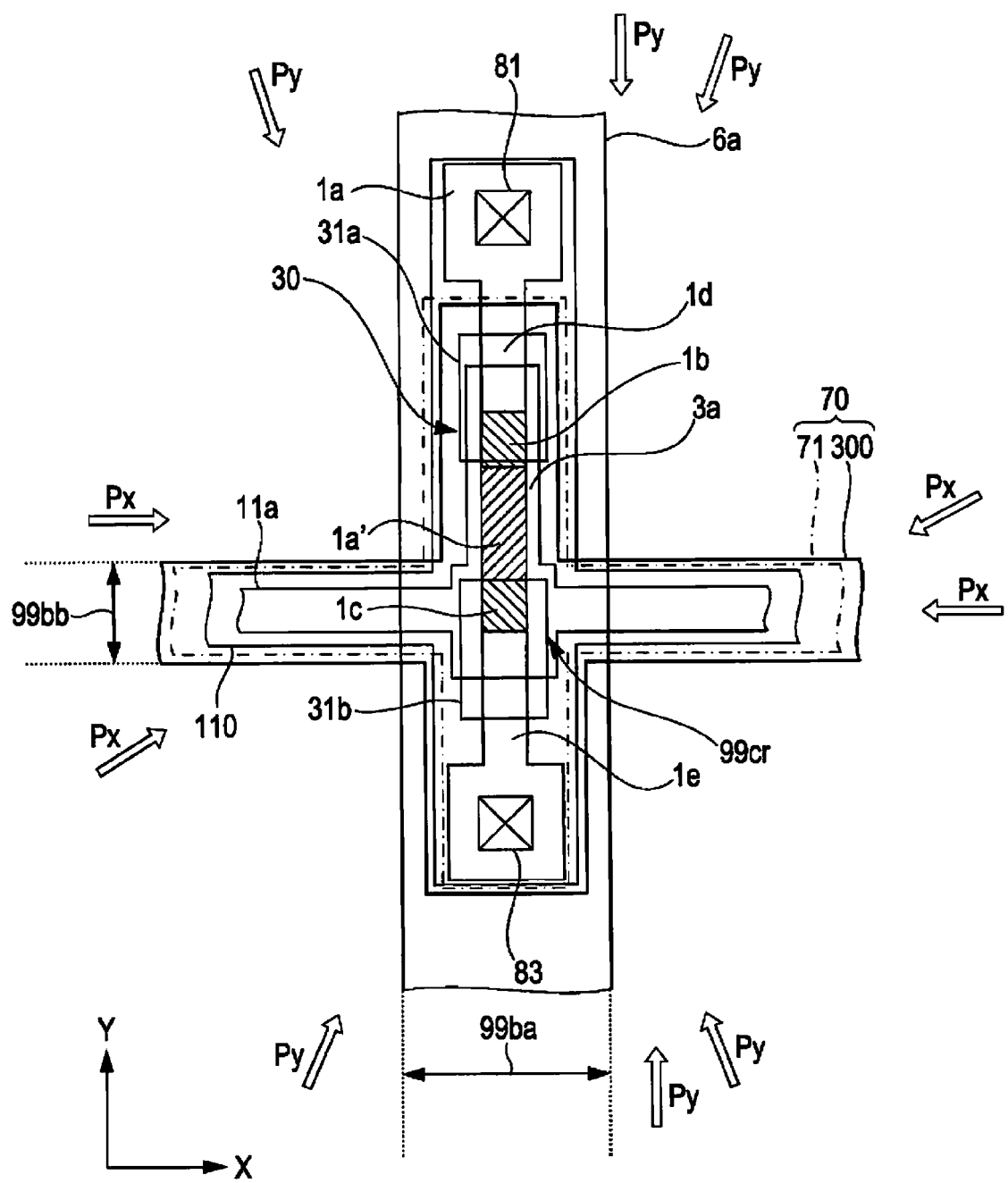
FIG. 5 is a plan view that focuses on a transistor and that shows the configuration of the transistor.
Figure 6:
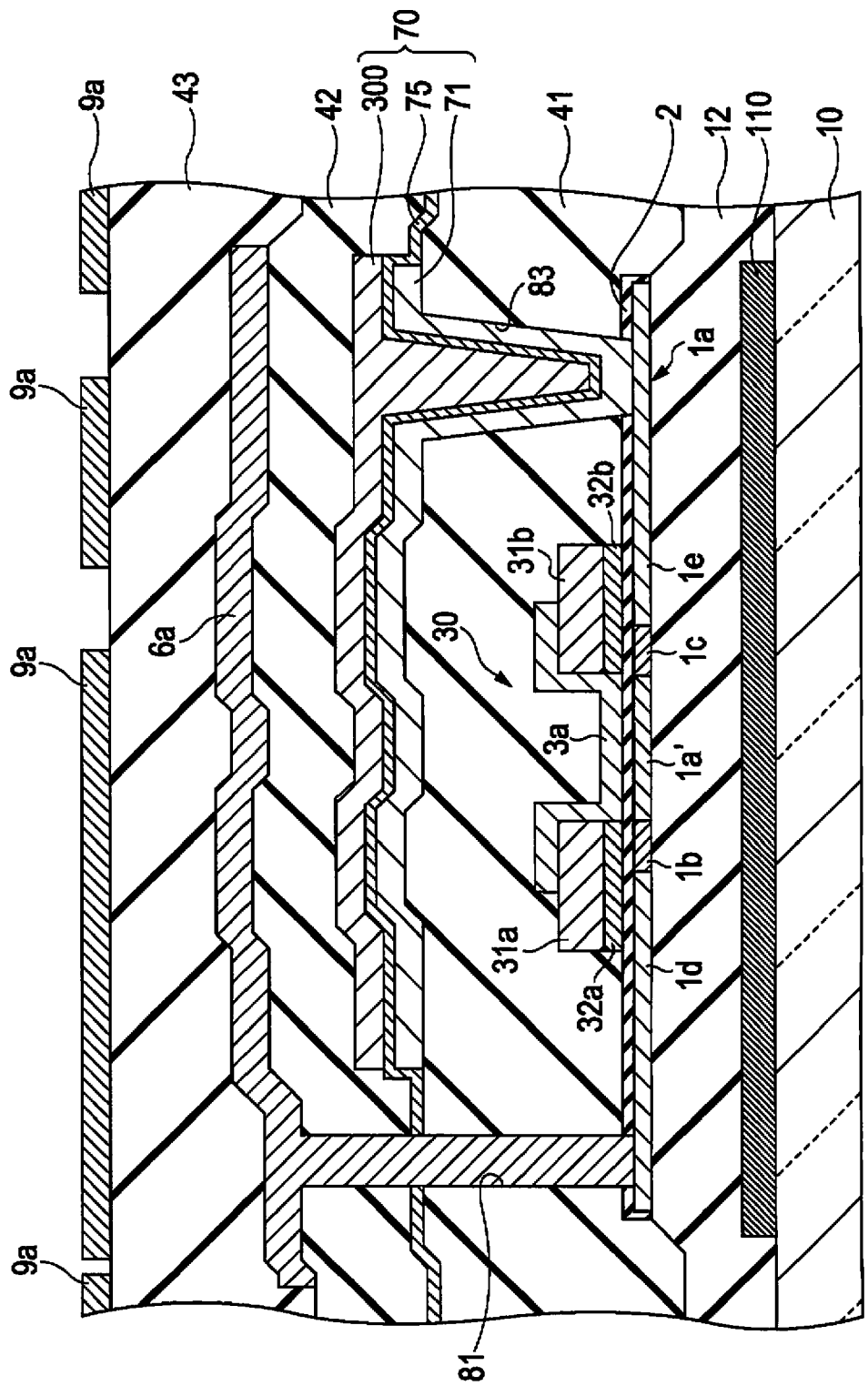
FIG. 6 is a cross-sectional view that is taken along the line VI-VI in FIG. 4.
Figure 7:
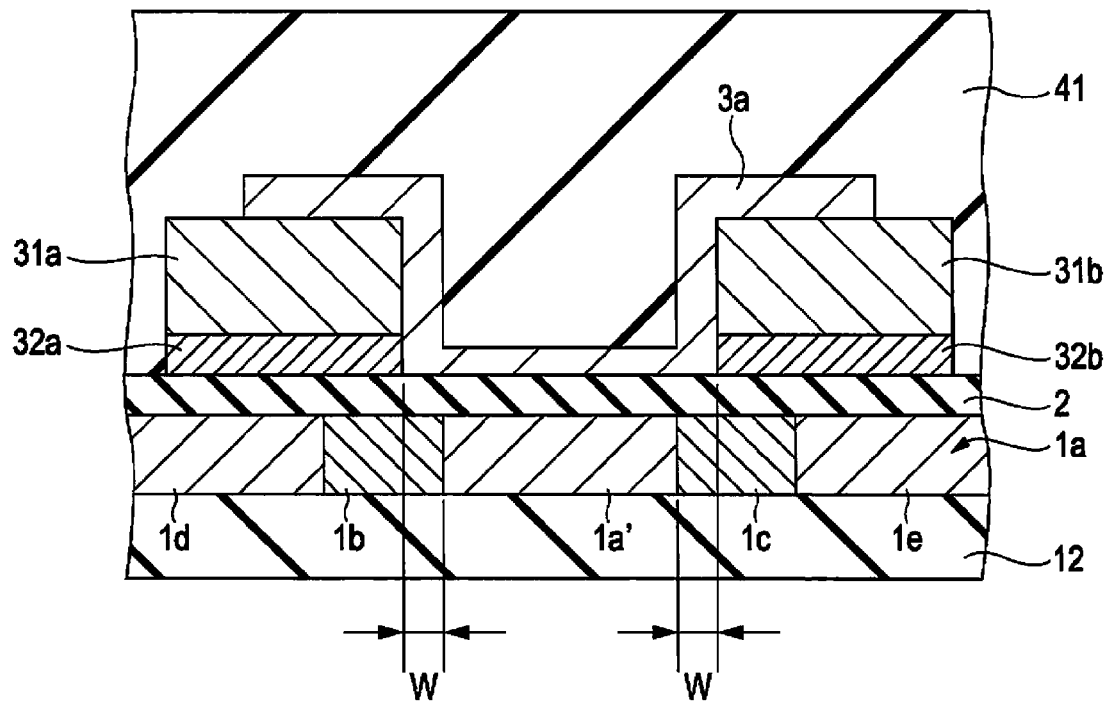
FIG. 7 is an enlarged view of the transistor portion shown in FIG. 6.
Figure 8:
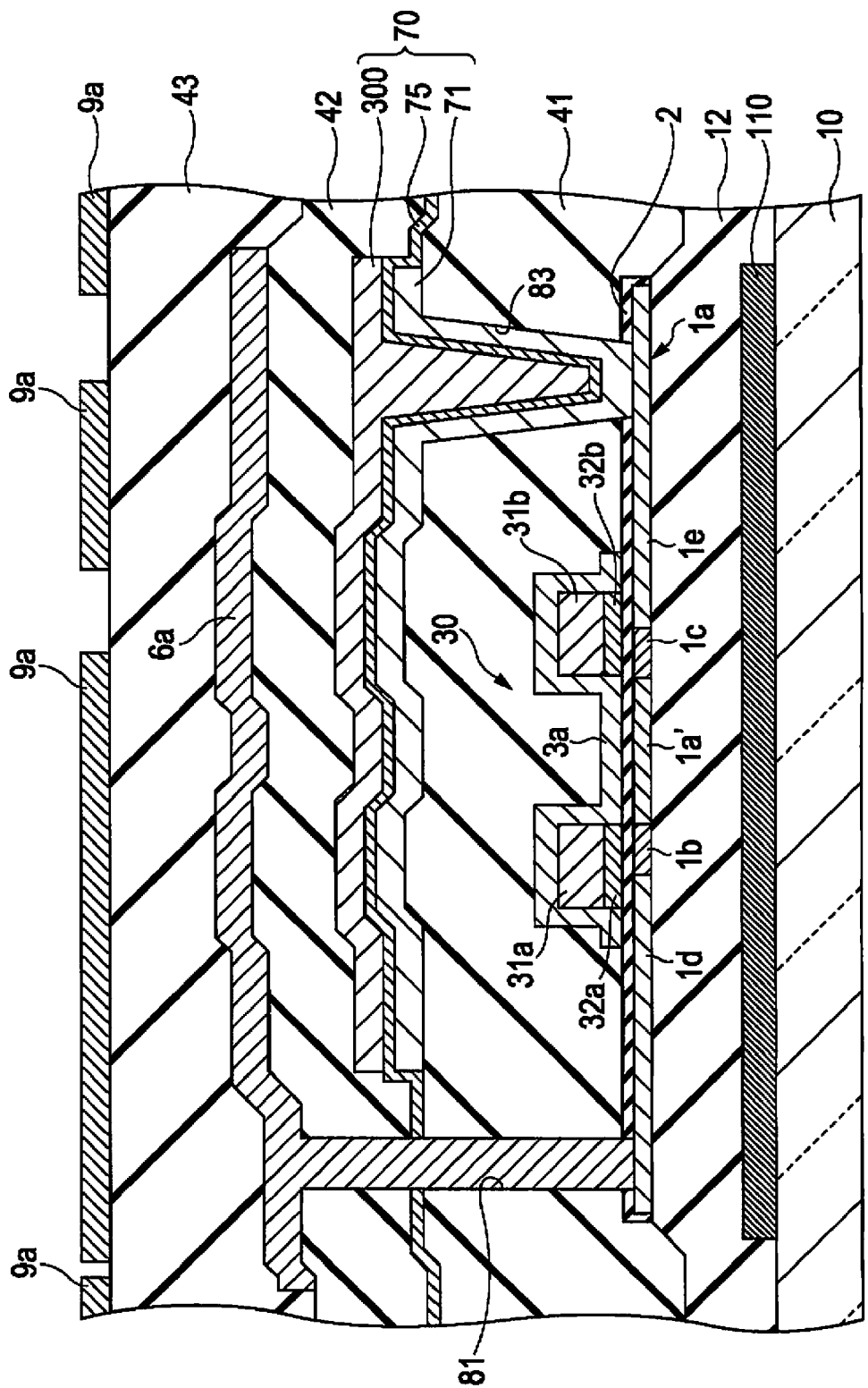
FIG. 8 is a cross-sectional view that shows an alternative example of the liquid crystal device according to the embodiment.
Figure 9:
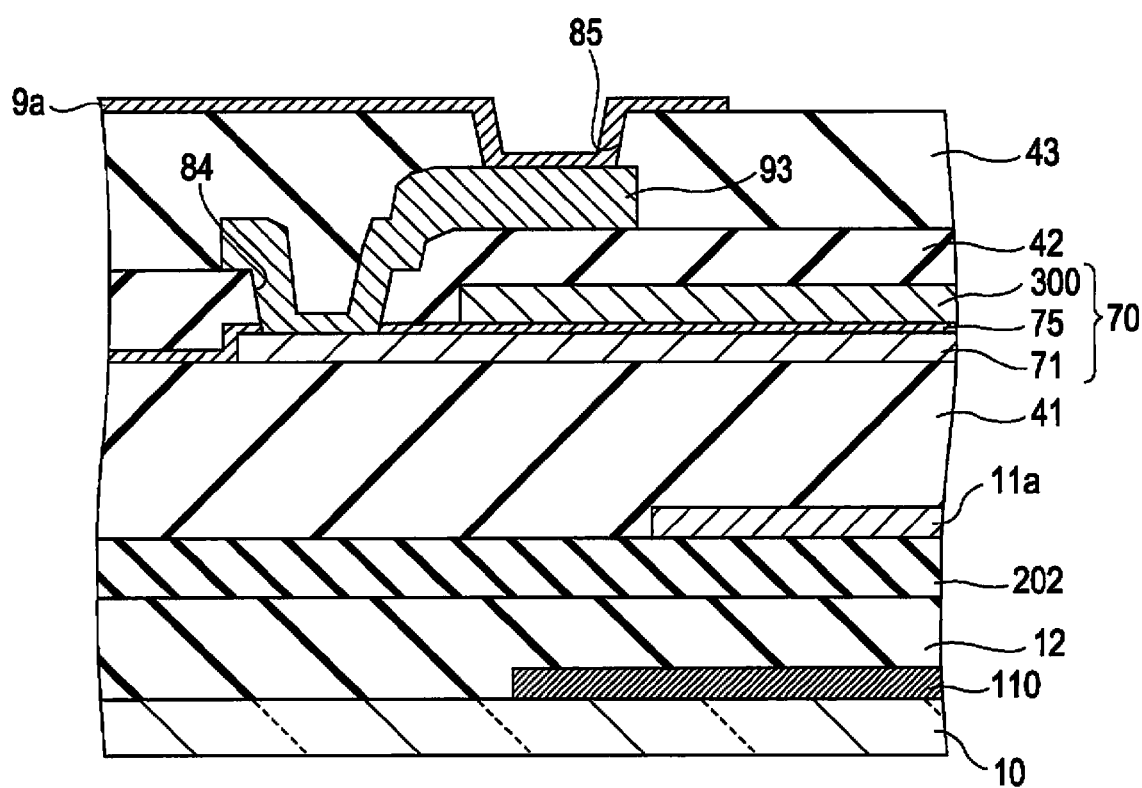
FIG. 9 is a cross-sectional view that is taken along the line IX-IX in FIG. 4.

Next, the specific configuration of the pixel portions that implement the above operation will be described with reference to FIG. 4 to FIG. 9 in addition to FIG. 1 to FIG. 3. FIG. 4 is a plan view of the plurality of mutually adjacent pixel portions. FIG. 5 is a plan view that focuses on the transistor and that shows the configuration of the transistor. FIG. 6 is a cross-sectional view that is taken along the line VI-VI in FIG. 4. FIG. 7 is an enlarged view of the transistor portion shown in FIG. 6. FIG. 8 is a cross-sectional view that shows an alternative example of the liquid crystal device according to the present embodiment. FIG. 9 is a cross-sectional view that is taken along the line IX-IX in FIG. 4.

Note that, in FIG. 4 to FIG. 9, in order to make it easier to recognize the layers and components in the drawings, the scales of the components are appropriately varied. This also applies to the relevant drawings, which will be described later. In FIG. 4 to FIG. 9, only the configuration of the TFT array substrate side will be described among the configurations described with reference to FIG. 1 or in FIG. 2; however, for easier description, portions located on or above the pixel electrodes 9a are not shown in these drawings. In FIG. 5, focusing on the transistor, a configuration of the transistor is shown in detail, and the arrangement relationship among various films that constitute the data line, the scanning line and the storage capacitor with respect to the transistor in the non-aperture region is schematically shown as well.

In FIG. 4, the plurality of pixel electrodes 9a are provided on the TFT array substrate 10 in a matrix. The data lines 6a and the scanning lines 11a are provided along vertical and horizontal boundaries between the adjacent pixel electrodes 9a. The scanning lines 11a extend along the X direction in FIG. 4, and the data lines 6a extend along the Y direction in FIG. 4 so as to intersect with the scanning lines 11a. The pixel switching TFTs 30 are provided at positions at which the scanning lines 11 and the data lines 6a intersect with each other, as shown in the enlarged view in FIG. 5.

The scanning lines 11a, the data lines 6a, the TFTs 30, the storage capacitors 70, lower side light shielding films 110, and relay layers 93 are arranged in a non-aperture region 99b on the TFT array substrate 10, which surrounds aperture regions 99a of the pixels (that is, regions of the pixels, in which light is transmitted or reflected to contribute to actual display) corresponding to the pixel electrodes 9a, as viewed in plan. That is, these scanning lines 11a, data lines 6a, TFTs 30, storage capacitors 70, lower side light shielding films 110 and relay layers 93 are arranged not in the aperture regions 99a of the pixels but in the non-aperture region 99b so as not to hinder display.

The non-aperture region 99b is formed on the side of the TFT array substrate 10 as a region that is able to block light that would enter the pixels by light shielding films, which are, for example, formed of at least a portion of conductive films that constitute the data lines 6a, the scanning lines 11a or the storage capacitors 70, formed on the side of the TFT array substrate 10, having a light shielding property. More specifically, the non-aperture region 99b includes a first region 99ba extending along the Y direction and a second region 99bb extending along the X direction. In addition, preferably, as described with reference to FIG. 2, the non-aperture region 99b is defined by the light shielding films 23 formed on the side of the opposite substrate 20 in cooperation with the light shielding films on the side of the TFT array substrate 10.

Hereinafter, the components of the pixel portion shown in FIG. 6 will be described sequentially from the lower layer side.

In FIG. 6, the lower side light shielding film 110 is arranged on the TFT array substrate 10 and is, for example, formed of light shielding conductive material, such as a high-melting point metal material that includes tungsten (W), titanium (Ti), titanium nitride (TiN), and the like. As shown in FIG. 4 or FIG. 5, the lower side light shielding films 110 are formed, for example, along a direction in which the scanning lines 11a extend (that is, in the X direction). That is, the lower side light shielding films 110 are formed in a stripe in the image display area 10a at positions corresponding to the scanning lines 11a. Owing to the lower side light shielding films 110, it is possible to substantially or completely block light that travels toward the TFTs 30 among return light, such as light reflected on the rear face of the TFT array substrate 10 and/or light that is emitted, in a double-plate projector, from another liquid crystal device and that penetrates through a composite optical system.

Furthermore, the lower side light shielding films 110 may be used to redundantly serve as scanning lines in such a manner that the lower side light shielding films 110 are electrically connected to the scanning lines 11a through contact holes, or the like.

The base insulating film 12 is, for example, formed of silicon oxide film. The base insulating film 12 has a function to prevent the surface of the TFT array substrate 10 from being rough while the surface is being polished and a function to prevent the characteristics of the pixel switching TFT 30 from being changed because of dirt that is left after washing, or the like, by forming the base insulating film 12 all over the TFT array substrate 10.

In FIG. 4 to FIG. 6, each of the TFTs 30 is formed to include a semiconductor layer 1a and a gate electrode 3a.

Each of the semiconductor layers 1a is, for example, formed of polysilicon and includes a channel region 1a' having a channel length along the Y direction in FIG. 4, a data line side LDD region 1b, a pixel electrode side LDD region 1c, a data line side source/drain region 1d and a pixel electrode side source/drain region 1e. That is, each of the TFTs 30 has an LDD structure. Note that the data line side LDD region 1b is one example of a "first junction region" according to the aspects of the invention, and the pixel electrode side LDD region 1c is one example of a "second junction region" according to the aspects of the invention.

The data line side source/drain region 1d and the pixel electrode side source/drain region 1e are formed in substantially mirror symmetry along the Y direction with respect to the channel region 1a'. That is, the data line side LDD region 1b is formed between the channel region 1a' and the data line side source/drain region 1d. The pixel electrode side LDD region 1c is formed between the channel region 1a' and the pixel electrode side source/drain region 1e. The data line side LDD region 1b, the pixel electrode side LDD region 1c, the data line side source/drain region 1d and the pixel electrode side source/drain region 1e are impurity regions that are formed by implanting impurities into the semiconductor layer 1a by means of impurity implantation, such as ion implantation, for example. The data line side LDD region 1b and the pixel electrode side LDD region 1c are formed as low-concentration impurity regions that respectively have smaller impurities than the data line side source/drain region 1d and the pixel electrode side source/drain region 1e. According to the above impurity regions, while the TFT 30 is not operating, it is possible to reduce an off current that flows through the source region and the drain region and also possible to suppress a decrease in on current that flows while the TFT 30 is operating. Note that the TFT 30 preferably has an LDD structure; however, the TFT 30 may have an offset structure in which impurities are not implanted in the data line side LDD region 1b and the pixel electrode side LDD region 1c, or may have a self-aligned structure in which the data line side source/drain region and the pixel electrode side source/drain region are formed by densely implanting impurities using the gate electrode as a mask.

In the upper layer side on the data line side LDD region 1b and the data line side source/drain region 1d of the semiconductor layer 1a, a first insulating film 31a is provided through a gate insulating film 2 and a first nitride film 32a. Similarly, in the upper layer side on the pixel electrode side LDD region 1c and the pixel electrode side source/drain region 1e, a second insulating film 31b is provided through the gate insulating film 2 and a second nitride film 32b. The first insulating film 31a and the second insulating film 31b are, for example, formed of silicon dioxide ($SiO_2$). In addition, the first nitride film 32a and the second nitride film 32b are, for example, formed of silicon nitride (SiN), and have the function of shielding light that would enter from the upper layer side of the semiconductor layer 1a.

The scanning lines 11a are arranged on the upper layer side above the semiconductor layer 1a through an insulating film 202, which is, for example, formed of silicon oxide film, or the like. The scanning lines 11a are, for example, formed of conductive polysilicon, and are formed to extend in the X direction. Gate electrodes 3a, which have a light shielding property, form portions of the scanning lines 11a. The gate electrodes 3a each are provided so as to overlap the channel region 1a' in plan view through the gate insulating film 2. Furthermore, each gate electrode 3a is provided so as to overlap the data line side LDD region 1b, the data line side source/drain region 1d, the pixel electrode side LDD region 1c and the pixel electrode side source/drain region 1e.

Here, because the first insulating film 31a and the second insulating film 31b are provided, each gate electrode 3a is provided so as to extend onto the first insulating film 31a and the second insulating film 31b. Therefore, the gate electrode 3a is arranged at positions that are space apart from the semiconductor layer in the regions that overlap the data line side LDD region 1b, the data line side source/drain region 1d, the pixel electrode side LDD region 1c and the pixel electrode side source/drain region 1e, as compared with the region that overlaps the channel region 1a'. Thus, the gate electrode 3a is arranged adjacent to the data line side LDD region 1b and the pixel electrode side LDD region 1c but not to an extent that the gate electrode 3a electrically influences the data line side LDD region 1b or the pixel electrode side LDD region 1c. Hence, it is possible to prevent the occurrence of malfunction in the transistor. In terms of this point of view, the first insulating film 31a and the second insulating film 31b each have, for example, a thickness of about several tens to several thousands nanometers (nm), and are formed to have substantially the same size as the LDD regions or have a much larger size than the LDD regions.

In addition, each gate electrode 3a has a light shielding property, so that light that would enter the data line side LDD region 1b or the pixel electrode side LDD region 1c from the upper layer side is blocked by the gate electrode 3a. Thus, each gate electrode 3a should have the original gate function and may be desirably formed of a single layer or multiple layers of a light shielding and opaque polysilicon film, metal film, metal silicide film, or the like, having, for example, a high reflectance or a high optical absorptance. However, when the material of each gate electrode 3a has some light shielding ability (that is, light reflecting ability or light absorbing ability), the gate electrode 3a provides the function of blocking light that would enter the data line side LDD region 1b or the pixel electrode side LDD region 1c as far as it has the above described specific shape and arrangement.

As shown in FIG. 7, the above described first insulating film 31a and the second insulating film 31b are desirably arranged at positions spaced at a predetermined distance W away from the channel region 1a' as viewed in plan on the substrate 10. The predetermined distance W is, for example, about 0.125 μm. Such arrangement makes it possible to suppress the occurrence of variations in the holding characteristics of the channel region 1a'. In addition, because light leakage current mostly tends to occur at the interface between the channel region 1a' and the pixel electrode side LDD region 1c, the above configuration produces improvement in light shielding property at the interface.

The above described configuration of each gate electrode 3a is just an example and may, for example, employ the following configuration.

As shown in FIG. 8, each gate electrode 3a may be provided so as to extend over the first insulating film 31a and the second insulating film 31b to positions that respectively face portions of the data line side source/drain region 1d and the pixel electrode side source/drain region 1e through the gate insulating film 2. The above configuration makes it possible to block light that would obliquely enter, for example, the data line side LDD region 1b or the pixel electrode side LDD region 1c from the upper layer side of the data line side source/drain region 1d or the pixel electrode side source/drain region 1e. Thus, it is possible to further effectively prevent the occurrence of light leakage current.

Note that, because the data line side source/drain region 1d and the pixel electrode side source/drain region 1e are densely doped conductive layers, even when the gate electrode 3a is arranged adjacent to the data line side source/drain region 1d and the pixel electrode side source/drain region 1e as described above, an electric field generated at the gate electrode 3a substantially or completely does not electrically influence the data line side source/drain region 1*d* and the pixel electrode side source/drain region 1*e* to cause a malfunction in the transistor in terms of practical use.

As described above, in the liquid crystal device according to the present embodiment, by providing the first insulating films 31*a*, the second insulating films 31*b*, the first nitride films 32*a* and the second nitride films 32*b*, the gate electrodes 3*a* may be arranged at positions at which light shielding may be appropriately achieved. Thus, it is possible to effectively block light that would enter the semiconductor layers 1*a* to prevent the occurrence of light leakage current.

In FIG. 5, the pixel electrode side LDD region 1*c* is arranged in the non-aperture region 99*b* at a crossover region 99*cr* at which the first region 99*ba* and the second region 99*bb* intersects with each other. In the crossover region 99*cr*, among rays of light that would enter the pixel electrode side LDD region 1*c* from an upper layer thereof, light that travels along a traveling direction indicated by the arrow Py in FIG. 5 may be blocked by the first region 99*ba*, and light that travels along a traveling direction indicated by the arrow Px in FIG. 5 may be blocked by the second region 99*bb*. Note that, in FIG. 5, the arrow Py indicates one example of a traveling direction of light having a component that travels along the Y direction, and the arrow Px indicates one example of a traveling direction of light having a component that travels along the X direction.

Thus, in the crossover region 99*cr*, in addition to the gate electrode 3*a*, it is possible to block light that travels toward the pixel electrode side LDD region 1*c* by the first region 99*ba* and the second region 99*bb*. Hence, it is possible to effectively reduce light that enters the pixel electrode side LDD region 1*c*.

Here, as will be described later in detail, the inventors of the present application have estimated that light leakage current tends to occur in the TFT 30 particularly when light is irradiated to the pixel electrode side LDD region 1*c* than when light is irradiated to the data line side LDD region 1*b*. In the present embodiment, a light shielding property pinpoint to the pixel electrode side LDD region 1*c* among the various regions formed in the semiconductor layer 1*a* may be enhanced. Thus, it is possible to effectively reduce light leakage current of the TFT 30 in each pixel.

In addition, in the present embodiment, even when no additional light shielding region, other than the crossover region 99*cr*, is provided for the pixel electrode side LDD region 1*c*, it is possible to enhance a light shielding property pinpoint to the pixel electrode side LDD region 1*c*. Thus, by providing a region for pinpoint enhancement of a light shielding property, an area of arrangement for the non-aperture region 99*b* increases and, hence, it is possible to prevent the aperture regions 99*a* from being reduced. As a result, even when the pixels are miniaturized, it is possible to improve the pinpoint light shielding property and to further improve the aperture ratio.

In FIG. 6, the storage capacitor 70 is provided in an upper layer than the TFT 30 on the TFT array substrate 10 through an interlayer insulating film 41.

The storage capacitor 70 is formed so that a lower capacitor electrode 71 and an upper capacitor electrode 300 are opposed to each other through a dielectric film 75.

The upper capacitor electrode is formed as portion of the capacitor line 300. Although the configuration of the capacitor line 300 is not shown in the drawing, the capacitor line 300 extends from the image display area 10*a*, in which the pixel electrodes 9*a* are arranged, to the periphery of the image display area 10*a*, and is electrically connected to a constant electric potential source. In this manner, the upper capacitor electrode 300 is maintained at a fixed electric potential and functions as a fixed electric potential side capacitor electrode. The upper capacitor electrode 300 is, for example, formed of an opaque metal film that contains metal, such as Al (aluminum), Ag (silver), for example, or alloy of them, and functions as an upper side light shielding film (internal light shielding film) that shields the TFT 30. Note that, the upper capacitor electrode 300 may be, for example, formed of metal element substance, alloy, metal silicide, or polysilicide, which contains at least one of high-melting point metals, such as Ti (titanium), Cr (chromium), W (tungsten), Ta (tantalum), Mo (molybdenum), Pd (palladium), or a laminated structure of them.

In FIG. 4 or FIG. 6, the lower capacitor electrode 71 is a pixel electric potential side capacitor electrode that is electrically connected to both the pixel electrode side source/drain region 1*e* of the TFT 30 and the pixel electrode 9*a*. More specifically, the lower capacitor electrode 71 is electrically connected through a contact hole 83 (see FIG. 4 and FIG. 6) to the pixel electrode side source/drain region 1*e* and also electrically connected through a contact hole 84 (see FIG. 4 and FIG. 9) to the relay layer 93. Furthermore, the relay layer 93 is electrically connected through a contact hole 85 (see FIG. 4 and FIG. 9) to the pixel electrode 9*a*. That is, the lower capacitor electrode 71, in cooperation with the relay layer 93, relays electrical connection between the pixel electrode side source/drain region 1*e* and the pixel electrode 9*a*. The lower capacitor electrode 71 is, for example, formed of conductive polysilicon or opaque metal film that contains, for example, metal, such as Al (aluminum), or alloy.

Here, the lower capacitor electrode 71 preferably not only functions as the pixel electric potential side capacitor electrode but also functions as a light absorption layer or a light shielding film arranged between the TFT 30 and the upper capacitor electrode 300, which serves as the upper side light shielding film. Thus, in the crossover region 99*cr*, light that would enter the pixel electrode side LDD region 1*c* from an upper layer thereof may be blocked by the upper capacitor electrode 300 and the lower capacitor electrode 71 as well.

The dielectric film 75 has a monolayer structure or a multilayer structure, which is, for example, formed of silicon oxide film, such as HTO (High Temperature Oxide) film or LTO (Low Temperature Oxide) film, silicon nitride film, or the like.

In FIG. 6 and FIG. 9, the data line 6*a* and the relay layer 93 are provided in an upper layer above the storage capacitor 70 through the interlayer insulating film 42 on the TFT array substrate 10.

The data line 6*a* is electrically connected to the data line side source/drain region 1*d* of the semiconductor layer 1*a* through a contact hole 81 that extends through the insulating film 202, the interlayer insulating film 41, the dielectric film 75 and the interlayer insulating film 42. The data line 6*a* and the inside of the contact hole 81 are, for example, formed of a material that contains Al (aluminum), such as Al—Si—Cu or Al—Cu, Al element substance, or a multilayer film formed of Al layer and TiN layer. The data line 6*a* also has a function to shield the TFT 30 against light.

As shown in FIG. 4 or FIG. 5, the data line 6*a* is formed in the crossover region 99*cr* so as to overlap the gate electrode 3*a*. Thus, in the crossover region 99*cr*, light that would enter the pixel electrode side LDD region 1*c* from an upper layer thereof may be blocked by the data line 6*a* as well.

In FIG. 4 and FIG. 9, the relay layer 93 is formed in the same layer as the data line 6*a* (see FIG. 6) on the interlayer insulating film 42. The data line 6*a* and the relay layer 93 are, for example, formed in such a manner that a thin film formed of a conductive material, such as a metal film, is formed on the interlayer insulating film 42 using thin-film formation method, and the thin film is partly removed, that is, patterned. Thus, the data line 6a and the relay layer 93 are formed so as to be spaced apart from each other. Thus, because the data line 6a and the relay layer 93 may be formed in the same process, it is possible to simplify a manufacturing process of the device.

In FIG. 6 and FIG. 9, the pixel electrode 9a is formed in an upper layer than the data line 6a through the interlayer insulating film 43. The pixel electrode 9a is electrically connected through the lower capacitor electrode 71, the contact holes 83, 84 and 85, and the relay layer 93 to the pixel electrode side source/drain region 1e of the semiconductor layer 1a. The contact hole 85 is formed so that a conductive material, such as ITO, that constitutes the pixel electrode 9a is deposited on the inner wall of a hole portion that is formed to extend through the interlayer insulating film 43. An alignment layer 16, on which a predetermined alignment process, such as rubbing process, has been performed, is provided on the upper surface of the pixel electrode 9a.

The configuration of the pixel portion as described above is common to the pixel portions. The above configured pixel portion is regularly formed in the image display area 10a (see FIG. 1).

Thus, in the liquid crystal device according to the present embodiment as described above, while the device is operating, it is possible to prevent the occurrence of display defects or to reduce a degree of display defect to such a degree that, on the display, it is not recognized as a display defect, because of an occurrence of light leakage current of the TFT 30. In addition, it is possible to easily miniaturize the pixels while preventing malfunction of the TFT 30 and/or a decrease in aperture ratio. As a result, in the present embodiment, it is possible to display a high-quality image in the liquid crystal device.

Here, the reason why light leakage current tends to occur in the pixel electrode side LDD region 1c while the TFT 30 is operating as described above, in comparison with the data line side LDD region 1b, will be described in detail with reference to FIG. 10 to FIG. 15.

Figure 10:
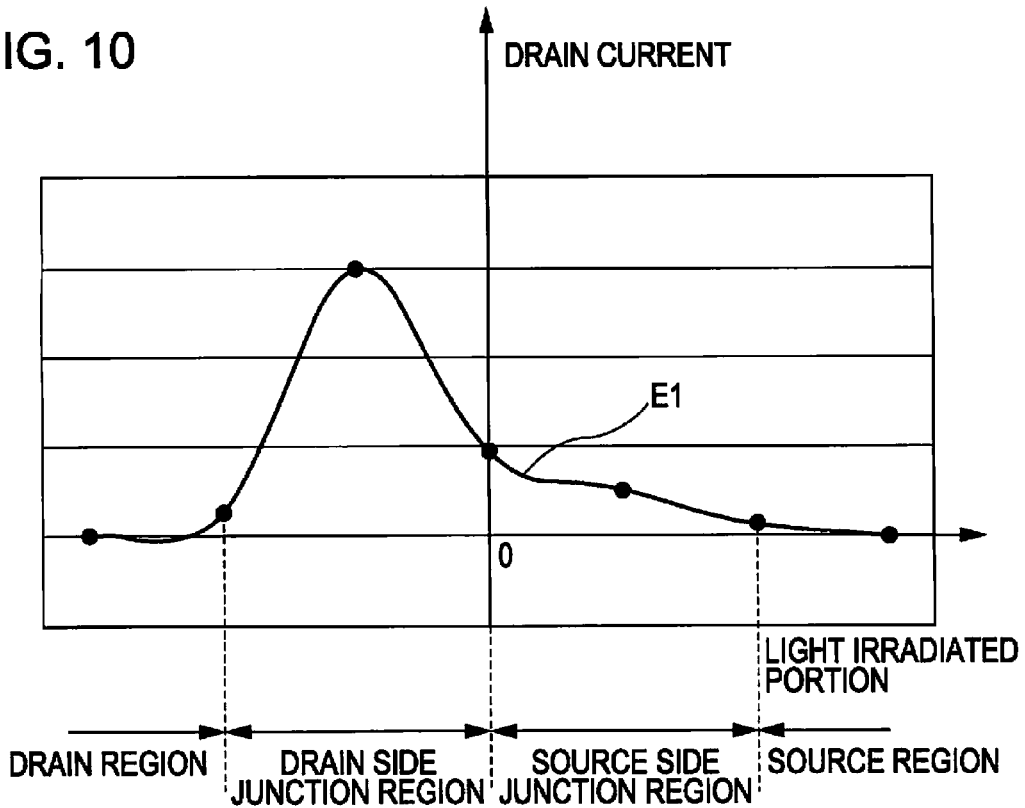
FIG. 10 is a graph that shows a relationship, in a testing TFT, between a light irradiated portion and a drain current.

First, the measured results that were obtained by measuring the magnitude of drain current when light is irradiated to a testing TFT will be described with reference to FIG. 10. FIG. 10 is a graph that shows a relationship, in a testing TFT, between a light irradiated portion and a drain current.

In FIG. 10, data E1 are results obtained by measuring the magnitude of drain current when a light spot (visible light laser of approximately 2.4 um) is irradiated to a testing single TFT, that is, TEG (Test Element Group), while being scanned sequentially from the drain region side to the source region side. The TEG has, in addition to the channel region, the source region and the drain region, a source side junction region formed at a junction between the channel region and the source region and a drain side junction region formed at a junction between the channel region and the drain region.

Note that the abscissa axis of FIG. 10 represents light irradiated portion to which a light spot is irradiated, and the boundary between the channel region and the drain side junction region, the boundary between the channel region and the source side junction region, and further the channel region are defined as zero. The ordinate axis of FIG. 10 represents the magnitude of drain current (however, a relative value that is normalized using a predetermined value). The ordinate axis indicates a positive value (that is, a plus value) when the drain current flows from the drain region to the source region. The ordinate axis indicates a negative value (that is, a minus value) when the drain current flows from the source region to the drain region.

In FIG. 10, the data E1 indicate a plus value at any light irradiated portions. That is, the data E1 indicate that the drain current flows from the drain region to the source region. In addition, the data E1 indicate a larger value in the drain side junction region than in the source side junction region. That is, the data E1 indicate that the drain current is larger when a light spot is irradiated to the drain side junction region than when a light spot is irradiated to the source side junction region. In other words, light leakage current becomes larger when a light spot is irradiated to the drain side junction region than when a light spot is irradiated to the source side junction region. Note that the drain current is composed of dark current (or a subthreshold leakage, that is, leakage current that flows, in an off state of TEG, between the source region and the drain region even in a state where light is not irradiated) and light leakage current (or photoexcited current, that is, current that is generated because of excited electron by irradiating light).

Figure 11:
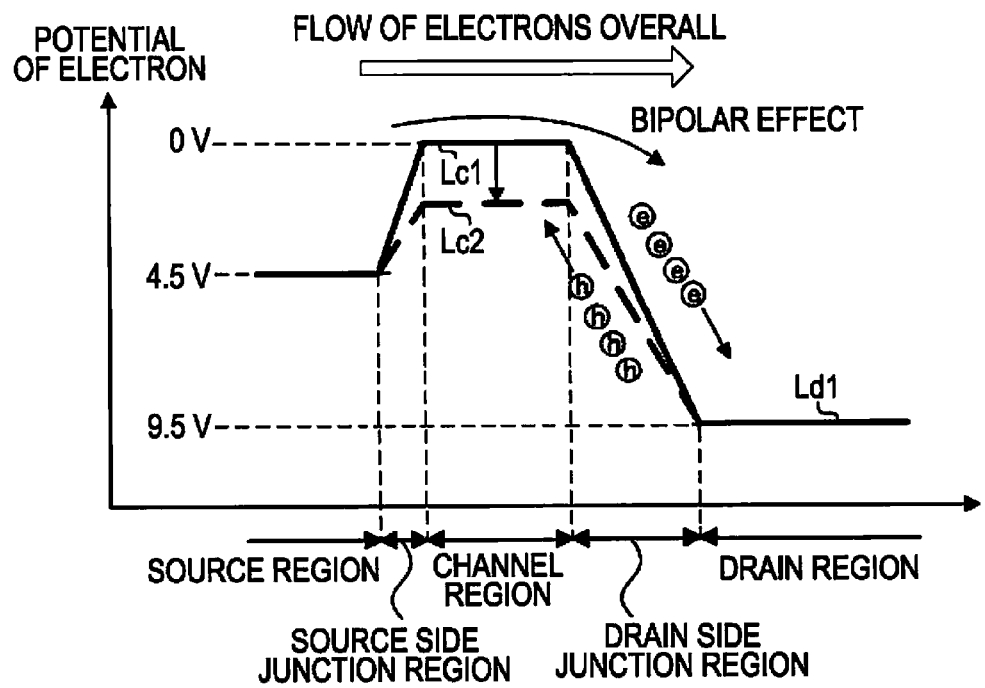
FIG. 11 is a conceptual diagram that shows the behavior of a carrier when photoexcitation occurs in a drain side junction region.
Figure 12:
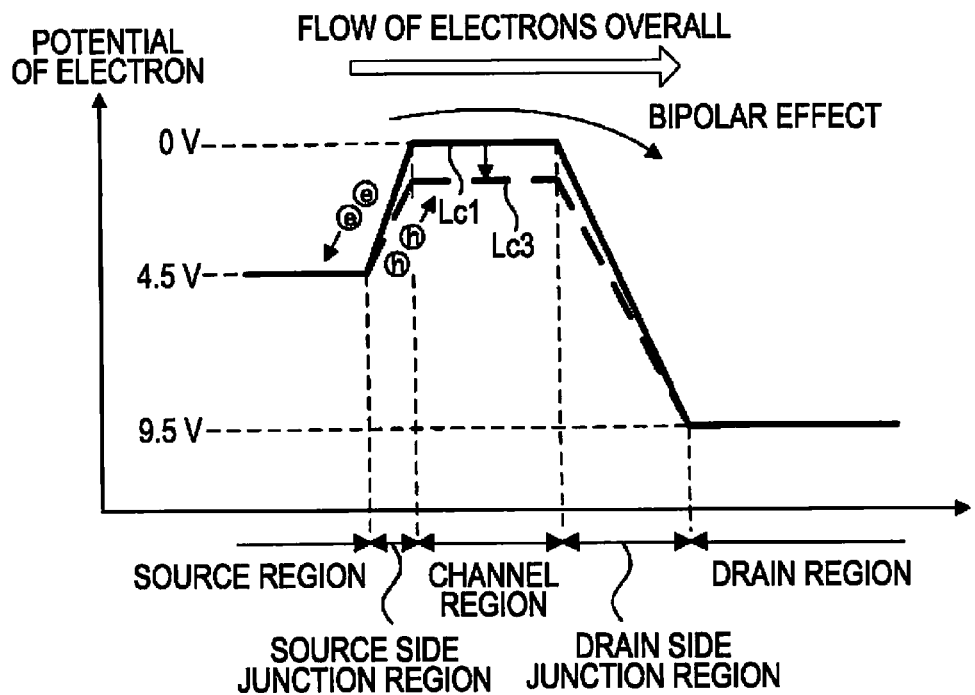
FIG. 12 is a conceptual diagram that shows the behavior of a carrier when photoexcitation occurs in a source side junction region.

Next, mechanism in which light leakage current becomes larger when a light spot is irradiated to the drain side junction region than when a light spot is irradiated to the source side junction region will be described with reference to FIG. 11 and FIG. 12. FIG. 11 is a conceptional diagram that shows the behavior of a carrier when photoexcitation occurs in the drain side junction region. FIG. 12 is a conceptional diagram that shows the behavior of a carrier when photoexcitation occurs in the source side junction region. Note that, in FIG. 11 and FIG. 12, by assuming display of a middle gray scale in the pixel electrode 9a that is electrically connected to the above described TFT 30, the source electric potential (that is, the electric potential of the source region) is 4.5 V, the gate electric potential (that is, the electric potential of the channel region) is 0 V, and the drain electric potential (that is, the electric potential of the drain region) is 9.5 V. The abscissa axes of FIG. 11 and FIG. 12 each represent regions in the semiconductor layer that constitutes the TEG. The ordinate axes of FIG. 11 and FIG. 12 each represent a potential of electron (Fermi level). Electron has a negative electric charge, so that the potential of electron becomes lower the higher the electric potential is in the region, and the potential of electron becomes higher the lower the electric potential is in the region.

FIG. 11 shows the behavior of a carrier when a light spot is irradiated to the drain side junction region formed between the channel region and the drain region and then photoexcitation occurs in the drain side junction region.

In FIG. 11, light leakage current may be estimated to be composed of two current components.

That is, as a first current component, the light leakage current has a current component because of movement of electrons generated by photoexcitation. More specifically, the first current component is a current component that is generated when electrons (see "e" in the drawing) generated by photoexcitation in the drain side junction region move from the drain side junction region to the drain region having a lower potential (this current component flows from the drain region to the source region).

As a second current component, the light leakage current has a current component because of movement of holes (that is, positive holes, denoted by "h" in the drawing) generated by photoexcitation. More specifically, the second current component is a current component because of the bipolar effect that is generated when holes generated by photoexcitation in the drain side junction region move from the drain side junction region to the channel region having a lower potential (that is, higher potential as to electrons). That is, the current component (this current component flows from the drain region to the source region) is due to the effect such that electrons that move from the source region to the drain region increase because the potential of the channel region (that is, a base potential) is reduced from a potential Lc1 to a potential Lc2 because of positive electric charges of holes that have moved to the channel region. Thus, when photoexcitation occurs in the drain side junction region, both the first current component and the second current component are generated in a direction (that is, in a direction from the drain region to the source region) to increase the drain current (in other words, collector current).

FIG. 12 shows the behavior of a carrier when a light spot is irradiated to the source side junction region formed between the channel region and the source region and then photoexcitation occurs in the source side junction region.

In FIG. 12, light leakage current may be estimated to be dominantly composed of the second current component due to the bipolar effect by which holes move from the source side junction region to the channel region having a lower potential (that is, higher potential as to electrons), which is different from the case where photoexcitation occurs in the drain side junction region as described with reference to FIG. 11. That is, it may be estimated that the first current component (this current component flows from the source region to the drain region) that is generated when electrons (see "e" in the drawing) generated by photoexcitation in the source side junction region move from the source side junction region to the source region having a lower potential is smaller than the second current component (this current component flows from the drain region to the source region) due to the bipolar effect.

In FIG. 12, the second current component due to the bipolar effect (that is, the current component due to the effect such that electrons that advances from the source region to the drain region because the base potential is reduced from a potential Lc1 to a potential Lc3 by positive electric charge of holes that have moved to the channel region) flows from the drain region to the source region. On the other hand, the above described first current component flows from the source region to the drain region. That is, the first current component and the second current component flow in the opposite directions. Here, referring back to FIG. 10, the drain current (see data E1) indicates a positive value when a light spot is irradiated from the source side junction region. That is, in this case, the drain current flows from the drain region to the source region. Thus, the first current component just suppresses the current component due to the bipolar effect, which is dark current or the second current component, and is not so large as to cause the drain current to flow from the source region to the drain region.

Moreover, because a difference in electric potential between the channel region and the source region is smaller than a difference in electric potential between the channel region and the drain region, a depleted region on the source region side (that is, the source side junction region) is narrower than a depleted region on the drain region side (that is, the drain side junction region). For this reason, when a light spot is irradiated to the source side junction region, the absolute magnitude of photoexcitation is small as compared with the case when a light spot is irradiated to the drain side junction region.

As described with reference to FIG. 10 and FIG. 11, when photoexcitation occurs in the drain side junction region, the first current component and the second current component both are generated to increase the drain current. On the other hand, when photoexcitation occurs in the source side junction region, the first current component suppresses the second current component. Thus, the drain current becomes larger (that is, light leakage current becomes large) when a light spot is irradiated to the drain side junction region than when a light spot is irradiated to the source side junction region.

Figure 13:
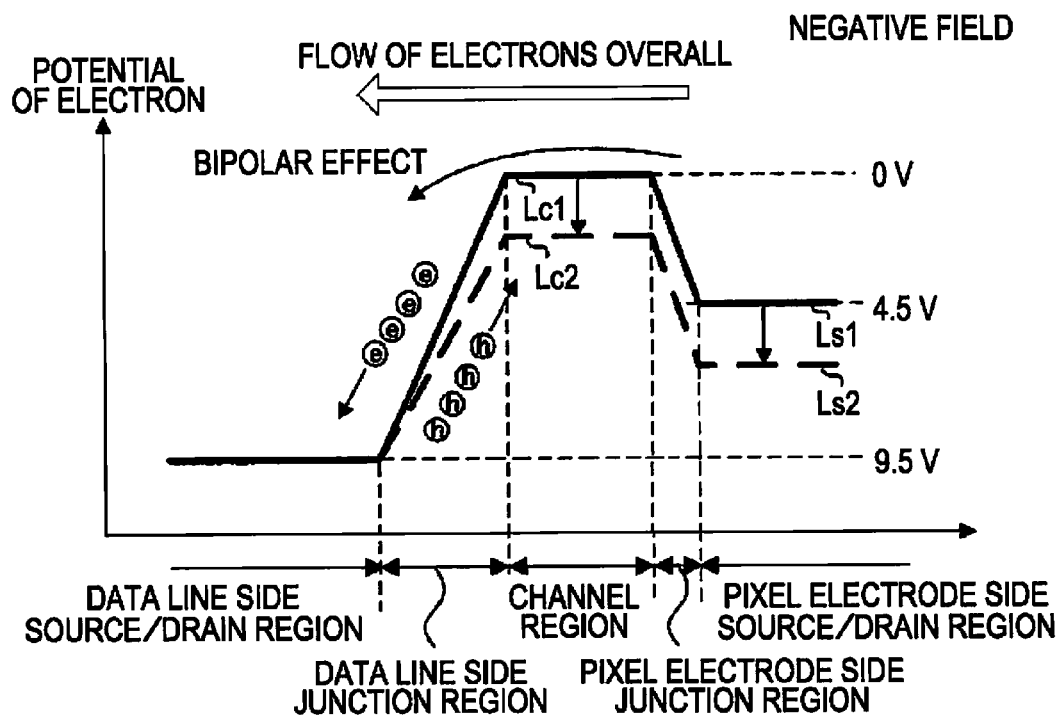
FIG. 13 is a conceptual diagram that shows the behavior of a carrier when photoexcitation occurs in a data line side junction region (in other words, a drain side junction region) in the case where a data line side source/drain region is applied with a drain electric potential.
Figure 14:
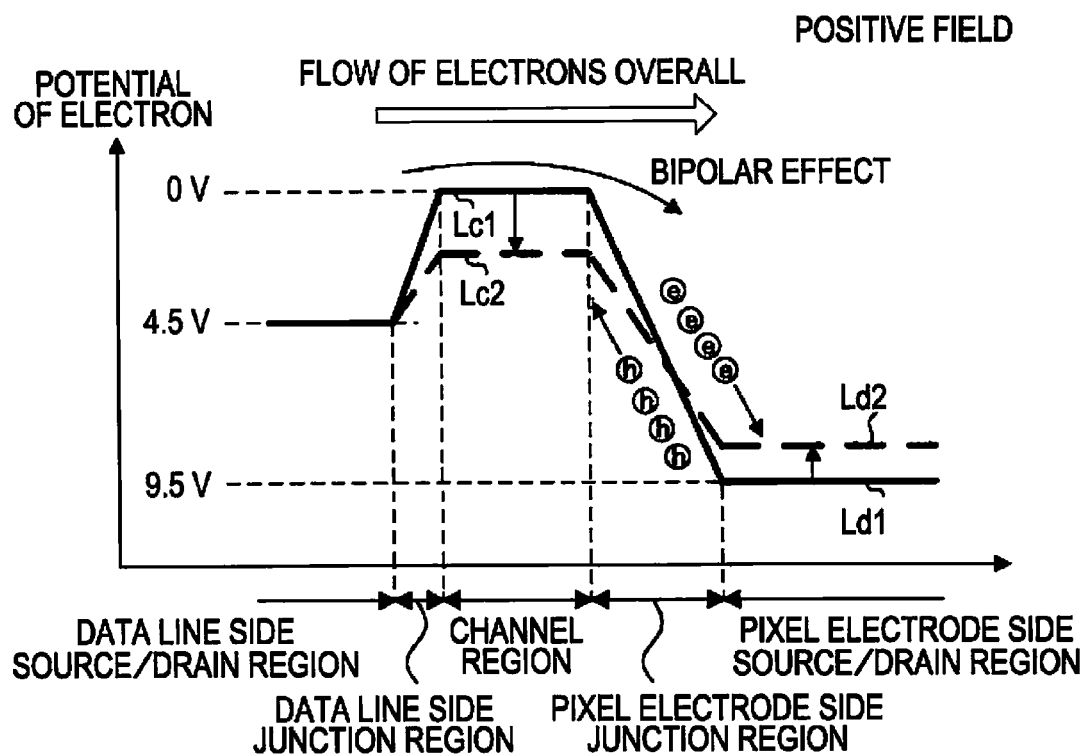
FIG. 14 is a conceptual diagram that shows the behavior of a carrier when photoexcitation occurs in a pixel electrode side junction region (in other words, a drain side junction region) in the case where the pixel electrode side source/drain region is applied with a drain electric potential.

Next, mechanism in which light leakage current increases when the pixel electrode side source/drain region is applied with a drain electric potential and a light spot is irradiated to the pixel electrode side junction region than when the data line side source/drain region is applied with a drain electric potential and a light spot is irradiated to the data line side junction region will be described with reference to FIG. 13 and FIG. 14. Here, FIG. 13 is a conceptional diagram that shows the behavior of a carrier when photoexcitation occurs in the data line side junction region (that is, the drain side junction region) in the case where the data line side source/drain region is applied with a drain electric potential. FIG. 14 is a conceptional diagram that shows the behavior of a carrier when photoexcitation occurs in the pixel electrode side junction region (in other words, the drain side junction region) in the case where the pixel electrode side source/drain region is applied with a drain electric potential.

Hereinafter, the case where electric charge is held at a pixel portion that includes a pixel switching TFT and photoexcitation has occurred will be considered. This differs from the case where the above described TEG is assumed in that the pixel electrode side of the pixel switching TFT may be made into a floating state. A holding capacitor, such as the storage capacitor 70, may be connected to the pixel electrode side of the pixel switching TFT. When the capacitance of the holding capacitor is sufficiently large, the pixel electrode side is made into a state similar to a fixed electrode as in the case that uses the above described TEG. However, when the capacitance of the holding capacitor is not sufficiently large, the pixel electrode side is made into a floating state or a state closer to the floating state. Note that, here, it is assumed that the above capacitance is not sufficiently large.

In FIG. 13 and FIG. 14, alternating current drive is employed in the liquid crystal device in order to prevent a so-called burn-in. Here, by assuming display of a middle gray scale, it is assumed when the pixel electrode is alternately held with an electric charge of 4.5 V negative field and an electric charge of 9.5 V positive field using 7 V as a reference electric potential. Therefore, the source and drain of the pixel switching TFT are not fixed but exchanged between the pixel electrode side source/drain region and the data line side source/drain region. That is, as shown in FIG. 13, when the electric charge of negative field is held by the pixel electrode (that is, when the electric potential of the pixel electrode side source/drain region is lower than the electric potential of the data line side source/drain region), the pixel electrode side source/drain region becomes a source. In contrast, as shown in FIG. 14, when the electric charge of positive field is held by the pixel electrode (that is, when the electric potential of the pixel electrode side source/drain region is higher than the electric potential of the data line side source/drain region), the pixel electrode side source/drain region becomes a drain.

In FIG. 13, when the electric charge of negative field is held by the pixel electrode, the pixel electrode side source/drain region becomes a source (or an emitter), and the data line side source/drain region becomes a drain (or a collector). When photoexcitation occurs in the data line side junction region, which is the drain side junction region, as described above, the first current component based on movement of electrons generated by the photoexcitation and the second current component due to the bipolar effect are generated. Here, when the second current component is generated on the basis of the bipolar effect (that is, the base potential is reduced from the potential Lc1 to the potential Lc2, and electrons move from the pixel electrode side source/drain region, which serves as a source, to the data line side source/drain region, which serves as a drain), electrons are taken out from the pixel electrode side source/drain region, which is in a floating state. Thus, the potential of the pixel electrode side source/drain region, which serves as an emitter, is reduced from the potential Ls1 to the potential Ls2 (the electric potential increases). That is, when photoexcitation occurs in the data line side junction region, which is the drain side junction region, the base potential decreases and the potential of the pixel electrode side source/drain region, which serves as an emitter, decreases. In other words, when photoexcitation occurs in the data line side junction region, which is the drain side junction region, the emitter electric potential increases as the base electric potential increases. For this reason, the drain current (that is, collector current) is suppressed.

On the other hand, in FIG. 14, when the electric charge of positive field is held by the pixel electrode, the data line side source/drain region becomes a source (or an emitter), and the pixel electrode side source/drain region becomes a drain (or a collector). When photoexcitation occurs in the pixel electrode side junction region, which is the drain side junction region, as described above, the first current component based on movement of electrons generated by the photoexcitation and the second current component due to the bipolar effect are generated. Here, because the data line side source/drain region, which serves as a source, is connected to the data line, the data line side source/drain region is not made into a floating state, unlike the pixel electrode, and the electric potential thereof does not change. Here, when the second current component is generated on the basis of the bipolar effect (that is, the base potential is reduced from the potential Lc1 to the potential Lc2, and electrons move from the data line side source/drain region, which serves as a source, to the pixel electrode side source/drain region, which serves as a drain), electrons flow to the pixel electrode side source/drain region, which is in a floating state. Thus, the potential of the pixel electrode side source/drain region, which serves as a collector, is increased from the potential Ld1 to the potential Ld2 (the electric potential decreases). However, the increase in potential of the pixel electrode side source/drain region, which serves as a collector, unlike the decrease in potential of the pixel electrode side source/drain region, which serves as a source as described above, hardly functions to suppress the drain current. The drain current (that is, collector current) is determined mainly on the basis of the magnitude of base electric potential relative to the emitter electric potential, so that a decrease in collector electric potential hardly suppresses the drain current, that is, the bipolar transistor enters a saturation region.

As described with reference to FIG. 13 and FIG. 14, when the electric charge of positive field is held by the pixel electrode (that is, when the pixel electrode side source/drain region becomes a drain), the second current component due to the bipolar effect is hardly suppressed; in contrast, when the electric charge of negative field is held by the pixel electrode (that is, when the data line side source/drain region becomes a drain), the second current component due to the bipolar effect is suppressed because of the increase in electric potential of the pixel electrode side source/drain region, which is in a floating state. That is, the drain current increases on the basis of light leakage current when the pixel electrode side source/drain region becomes a drain than when the data line side source/drain region becomes a drain.

Figure 15:
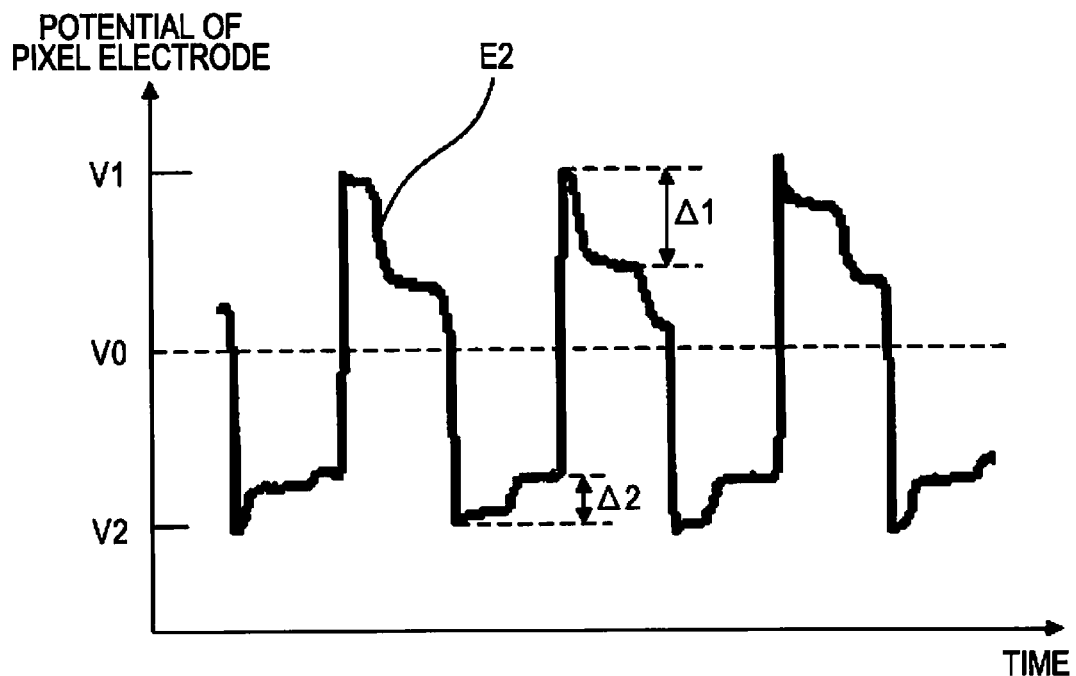
FIG. 15 is a view that shows the waveform of a pixel electrode electric potential when relatively intensive light is irradiated to the overall pixel switching TFT.

Here, FIG. 15 is a view that shows a waveform of a pixel electrode electric potential when relatively intensive light is irradiated to the overall pixel switching TFT.

In FIG. 15, data E2 indicate that the variation Δ1 in pixel electrode electric potential when the electric charge of positive field is held by the pixel electrode (when the pixel electrode electric potential is an electric potential V1) is larger than the variation in pixel electrode electric potential when the electric charge of negative field is held by the pixel electrode (when the pixel electrode electric potential is an electric potential V2). That is, the data E2 indicate that the electric charge of positive field is held poorer in the pixel electrode than the electric charge of negative field (that is, light leakage is likely to occur). This coincides with the above described mechanism in which light leakage current tends to occur when the electric charge of positive field is held by the pixel electrode (that is, when the pixel electrode side source/drain region becomes a drain) than when the electric charge of negative field is held by the pixel electrode (that is, when the data line side source/drain region becomes a drain).

As described above in detail with reference to FIG. 10 to FIG. 15, the drain current is likely to increase when photoexcitation occurs in the drain side junction region of the pixel switching TFT. Furthermore, the drain current is likely to increase when the pixel electrode side source/drain region becomes a drain (conversely, when the data line side source/drain region becomes a drain, the current component due to the bipolar effect is suppressed). Thus, as in the case of the liquid crystal device according to the present embodiment, by enhancing a light shielding property to the pixel electrode side LDD region 1c, which is the pixel electrode side junction region, higher than a light shielding property to the data line side LDD region 1b, which is the data line side junction region, it is possible to highly effectively reduce light leakage current in the TFT 30 while maintaining a high aperture ratio.

Method of Manufacturing Electro-Optical Device

Hereinafter, a manufacturing process of the liquid crystal device according to the above described present embodiment will be described with reference to FIG. 16A to FIG. 18B. Here, FIG. 16A to FIG. 18B are process drawings that sequentially show the steps of the manufacturing processes. Note that FIG. 16A to FIG. 18B show an image display transistor Pix and a driver transistor Dr separately for the transistor 30.

In addition, in the following description, the step of forming the transistor 30 will be described in detail, and description of the manufacturing processes for layers formed in the upper layer side or in the lower layer side of the transistor 30 will be omitted. A polysilicon film is formed through solid phase epitaxy or directly formed through low-pressure CVD, or the like, by performing heat treatment on an amorphous silicon film formed, for example, through low-pressure CVD, or the like, and then patterned to thereby form the semiconductor layers 1a. Note that the semiconductor layer 1a arranged on the left in the drawing constitutes the image display transistor Pix and the semiconductor layer 1a arranged on the left in the drawing constitutes the driver transistor Dr. At this time, the channel region 1a', the data line side LDD region 1b, the pixel electrode side LDD region 1c, the data line side source/drain region 1d and the pixel electrode side source/drain region 1e are not formed in the semiconductor layer 1a. After the semiconductor layers 1a are formed, the gate insulating film 2 is formed through thermal oxidation, or the like, so as to cover the formed semiconductor layers 1a in plan view.

Figure 16A:
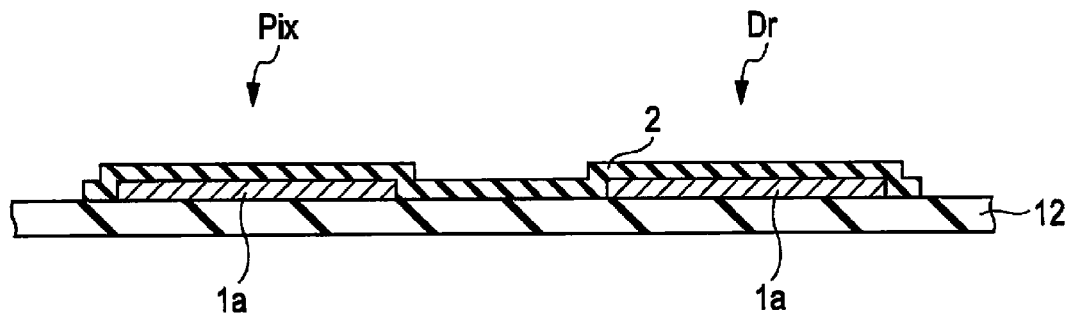
FIG. 16A to FIG. 16C are process drawings (Part I) that sequentially show the steps of a manufacturing process of the liquid crystal device according to the embodiment.
Figure 16B:
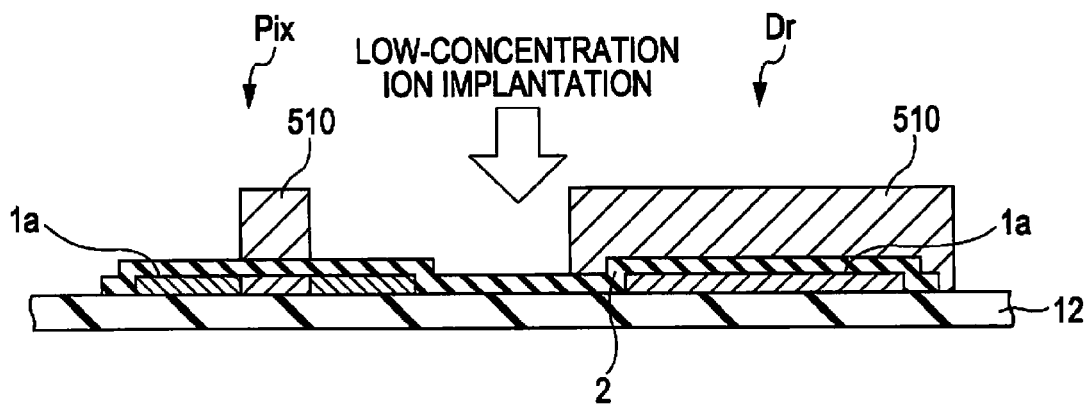

In the step shown in FIG. 16B, first masks 510, which serve as masks in ion implantation, are formed in the upper layer on the gate insulating film 2. The first mask 510 on the side of the image display transistor Pix is provided at a position that faces portion of the semiconductor layer 1a at which the channel region 1a' is formed. On the other hand, the first mask 510 on the side of the driver transistor Dr is provided so as to cover the entire surface of the semiconductor layer 1a. Subsequently, low-concentration ion is implanted into the semiconductor layer 1a from the upper layer side of the first masks 510. At this time, the low-concentration ion is implanted only into the portions of the semiconductor layer 1a, which are not covered with the first masks 510.

Figure 16C:
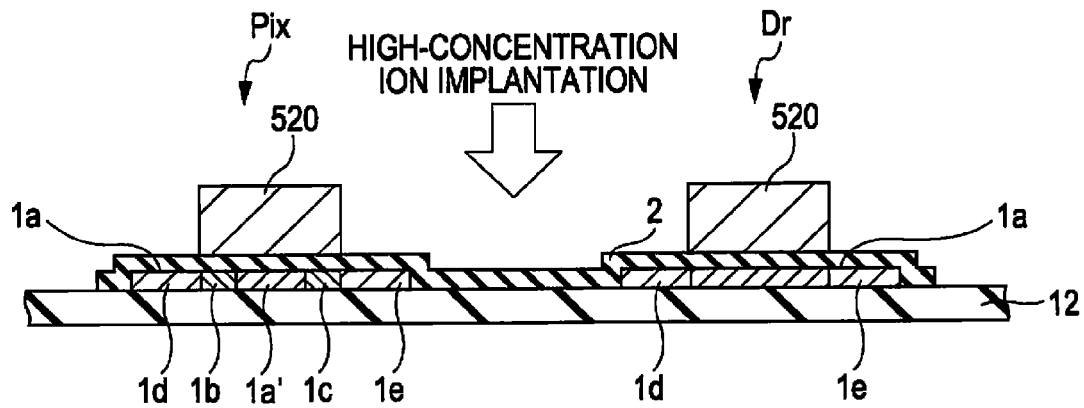

In the step shown in FIG. 16C, in place of the first masks 510, second masks 520 are formed. Note that the second masks 520 may be newly formed after removal of the first masks 510 or may be formed by partially removing the first masks 510 or partially adding a mask to the first masks 510. Each of the second masks 520 on the side of the image display transistor Pix and the second mask 520 on the side of the driver transistor Dr is provided at a position that faces portions at which the channel region 1a', the data line side LDD region 1b and the pixel electrode side LDD region 1c are formed. Subsequently, high-concentration ion is implanted into the semiconductor layers 1a from the upper layer side of the second masks 520. By so doing, on the side of the image display transistor Pix, the channel region 1a', the data line side LDD region 1b, the pixel electrode side LDD region 1c, the data line side source/drain region 1d and the pixel electrode side source/drain region 1e are formed. On the other hand, on the side of the driver transistor Dr, the data line side source/drain region 1d and the pixel electrode side source/drain region 1e are formed.

Figure 17A:
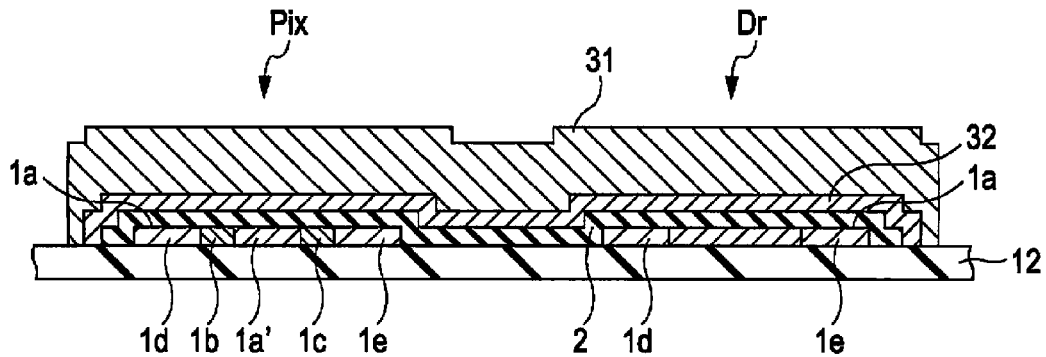
FIG. 17A to FIG. 17C are process drawings (Part II) that sequentially show the steps of a manufacturing process of the liquid crystal device according to the embodiment.

In the step shown in FIG. 17A, a nitride film 32 is formed, for example, by means of low-pressure CVD, plasma CVD, or the like, so as to cover the gate insulating film 2 in plan view. The nitride film 32 includes, for example, SiN and is formed to have a thickness of about 0.025 μm. Furthermore, an insulating film 31 is formed so as to cover the formed nitride film 32 in plan view. The insulating film 31 includes, for example, $SiO_2$ and is formed to have a thickness of about 0.3 to 0.4 μm. More specifically, here, for example, the insulating film 31 made of a silicate glass film, such as non-silicate glass (NSG), phosphorus silicate glass (PSG), boron silicate glass (BSG) or boron phosphorus silicate glass (BPSG), a silicon nitride film, a silicon oxide film, or the like, is formed by atmospheric pressure or low pressure CVD using tetraethylorthosilicate (TEOS) gas, tetraethylborate (TEB) gas, tetramethyloxyphoslate (TMOP) gas, or the like.

Figure 17B:
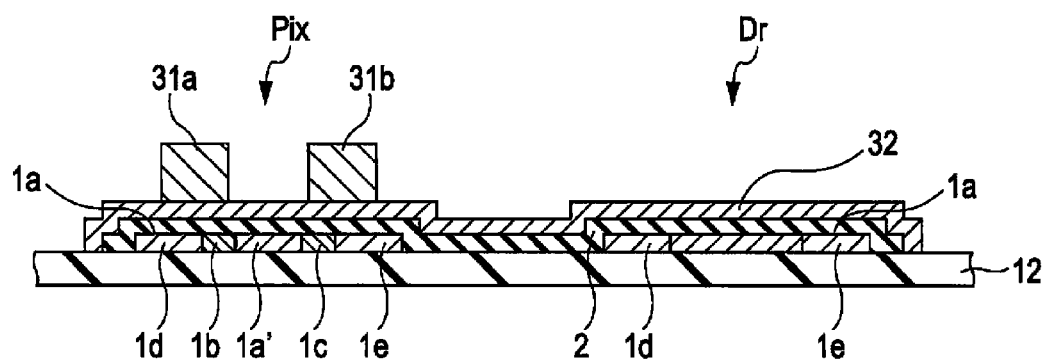

In the step shown in FIG. 17B, the insulating film 31 is patterned by etching to thereby form an island-shaped first insulating film 31a and an island-shaped second insulating film 31b. The first insulating film 31a and the second insulating film 31b, on the side of the image display transistor Pix, are formed so as to cover at least the data line side LDD region 1b and the pixel electrode side LDD region 1c in plan view. In addition, in addition to the above regions, the first insulating film 31a and the second insulating film 31b may be formed so as to cover the data line side source/drain region 1d and the pixel electrode side source/drain region 1e. Note that in this etching, the above described nitride film 32 serves as a protective film (so-called etch stopper film) that protects the gate insulating film 2 and the semiconductor layers 1a, which are formed in the lower layer.

Figure 17C:
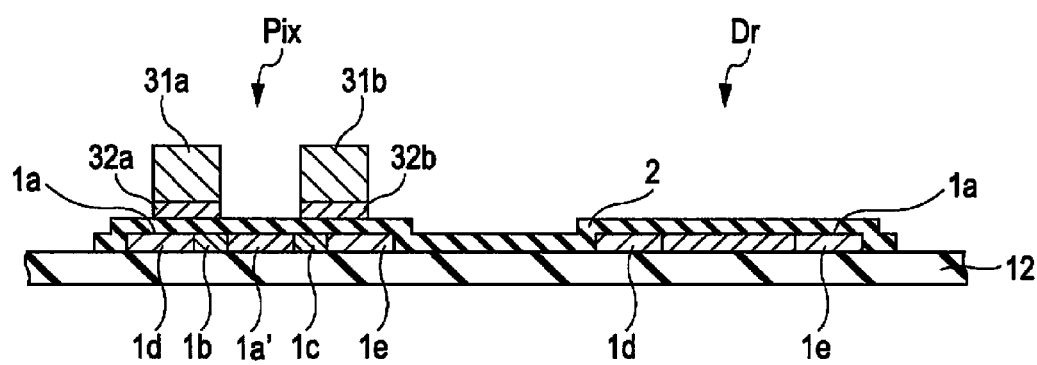

In the step shown in FIG. 17C, the nitride film 32 is removed through thermal phosphating. The thermal phosphating is performed, for example, at a temperature of 120 degrees C. to 130 degrees C. for about 20 minutes. In this thermal phosphating, the first insulating film 31a and the second insulating film 31b are not influenced and therefore not removed. In addition, the portions of the nitride film 32, covered with the first insulating film 31a and the second insulating film 31b, also remain as the first nitride film 32a and the second nitride film 32b. These first nitride film 32a and second nitride film 32b have a light shielding property and, therefore, provide a function of blocking light that would enter the semiconductor layer 1a.

Figure 18A:
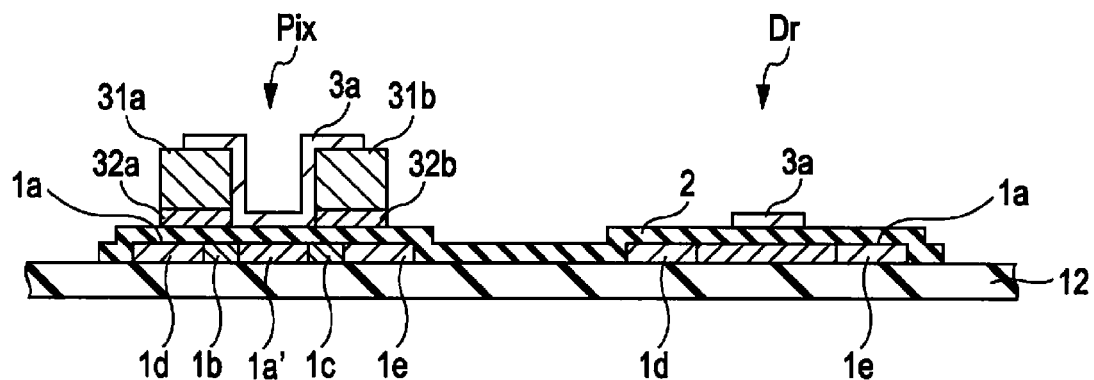
FIG. 18A and FIG. 18B are process drawings (Part III) that sequentially show the steps of a manufacturing process of the liquid crystal device according to the embodiment.

In the step shown in FIG. 18A, after polysilicon films are deposited through, for example, low-pressure CVD, or the like, phosphorus (P) is thermally diffused to make the polysilicon films conductive, thus forming the gate electrodes 3a. The gate electrode 3a on the side of the image display transistor Pix faces the channel region 1a' and is provided so as to extend onto the first insulating film 31a and the second insulating film 31b. On the other hand, the gate electrode 3a on the side of the driver transistor Dr is provided so as to face the portion at which the channel region 1a' is formed.

Figure 18B:
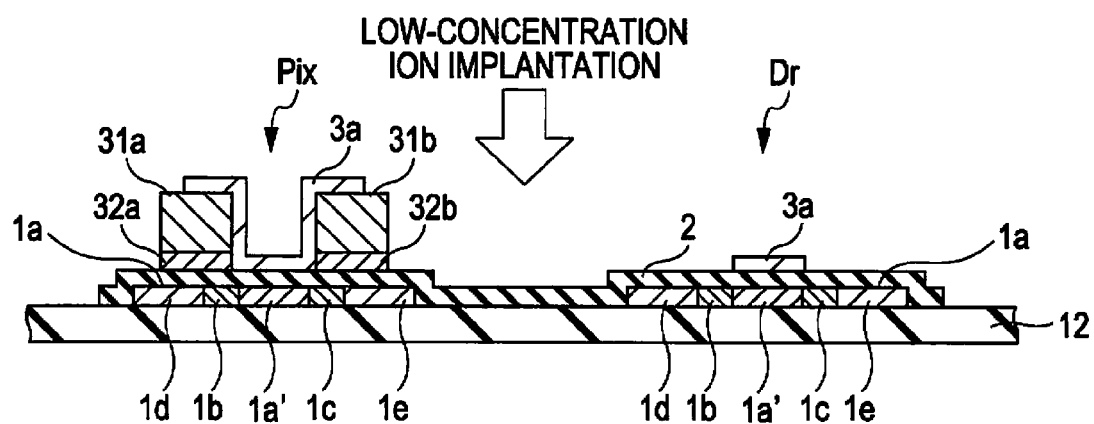

In the step shown in FIG. 18B, on the side of the driver transistor Dr, low-concentration ion is implanted into the semiconductor layer 1a from the upper layer side of the gate electrode 3a. By so doing, the channel region 1a', the data line side LDD region 1b and the pixel electrode side LDD region 1c are formed in the semiconductor layer 1a on the side of the driver transistor Dr. Note that when ion is implanted as described above, the gate electrode 3a serves as a mask. That is, the driver transistor Dr is a self aligning transistor.

Through the steps as described above, the transistor 30 is formed. According to the method of manufacturing the electro-optical device of the present embodiment, by forming the first insulating film 31a and the second insulating film 31b, it is possible to easily arrange the gate electrode 3a at an appropriate position. Thus, it is possible to further easily manufacture an electro-optical device that enables high-quality image display, as described above.

Electronic Apparatus

Figure 19:
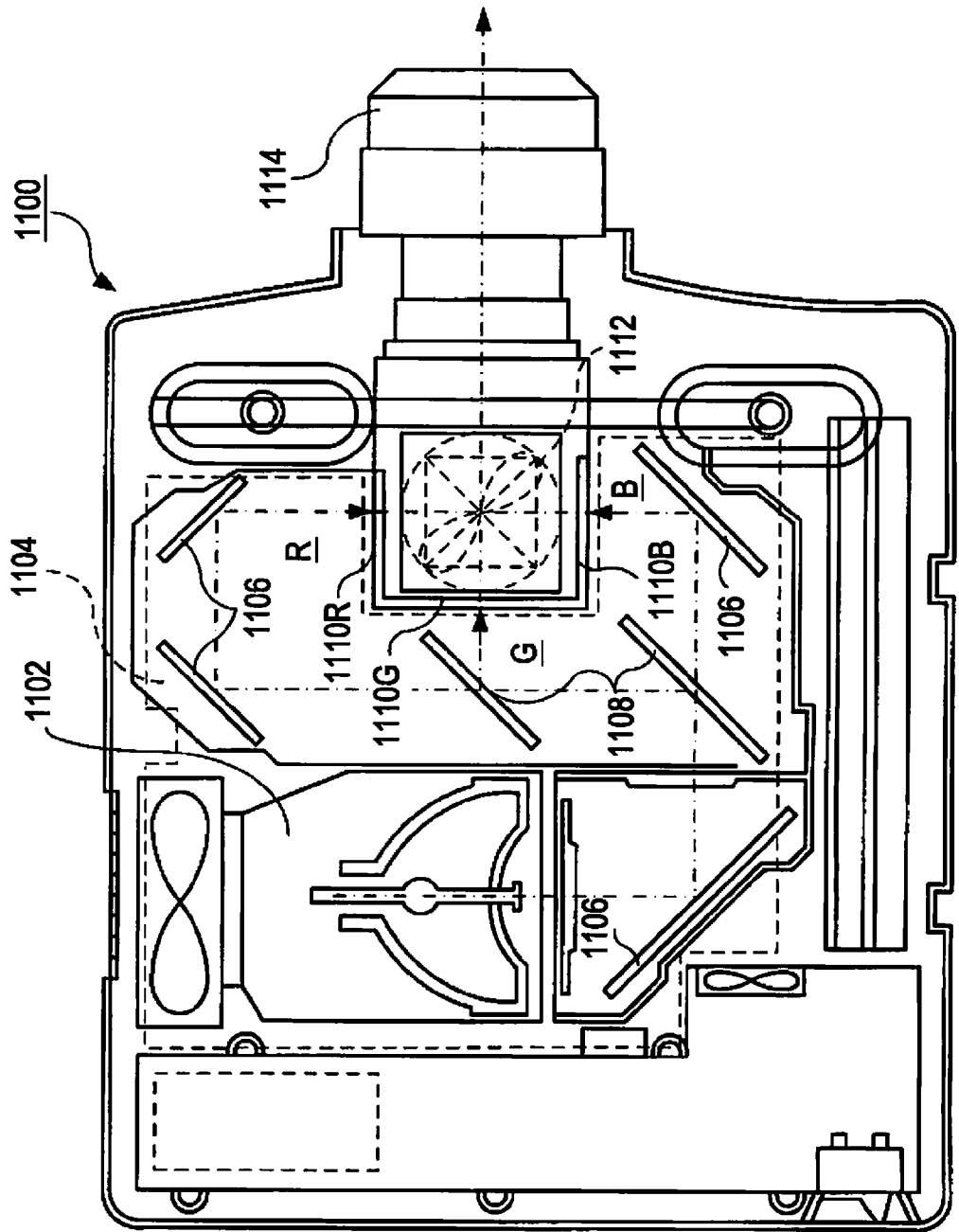
FIG. 19 is a plan view that shows the configuration of a projector, which is one example of an electronic apparatus to which the electro-optical device is applied.

Next, the case where the liquid crystal device, which is the above described electro-optical device, is applied to various electronic apparatuses will be described. Here, FIG. 19 is a plan view that shows a configuration example of a projector. Hereinafter, a projector that uses the liquid crystal device as a light valve will be described.

As shown in FIG. 19, a projector 1100 installs therein a lamp unit 1102 formed of a white light source, such as a halogen lamp. Light projected from the lamp unit 1102 is split into three primary colors, that is, RGB, by four mirrors 1106 and two dichroic mirrors 1108, which are arranged in a light guide 1104 and then enter liquid crystal panels 1110R, 1110B and 1110G, which are light valves corresponding to the primary colors.

The configurations of the liquid crystal panels 1110R, 1110B and 1110G are equivalent to the above described liquid crystal device, and are respectively driven by primary color signals of R, G, B, which are supplied from an image signal processing circuit. Then, light modulated by these liquid crystal panels enters a dichroic prism 1112 from the three directions. In this dichroic prism 1112, R light and B light are refracted at a right angle while, on the other hand, G light goes straight. Thus, by composing images corresponding to the respective colors, a color image is projected onto a screen, or the like, through a projection lens 1114.

Here, focusing on display images by the liquid crystal panels 1110R, 1110B and 1110G, the display image by the liquid crystal panel 1110G needs to be mirror reversed relative to the display images of the liquid crystal panels 1110R, 1110B.

Note that, because rays of light corresponding to the primary colors of R, G, B enter the liquid crystal panels 1110R, 1110B and 1110G by the dichroic mirrors 1108, no color filter needs to be provided.

Note that, in addition to the electronic apparatus described with reference to FIG. 19, the electronic apparatus may include a mobile personal computer, a cellular phone, a liquid crystal television, a viewfinder type or a direct view type video tape recorder, a car navigation system, a pager, a personal organizer, an electronic calculator, a word processor, a workstation, a video telephone, a point-of-sales terminal, and devices provided with a touch panel. Then, of course, the aspects of the invention may be applied to the above various electronic apparatuses.

In addition, the aspects of the invention may be applied to a reflective liquid crystal device (LCOS), a plasma display (PDP), a field emission display (FED, SED), an organic EL display, a digital micromirror device (DMD), an electrophoretic device, or the like, in addition to the liquid crystal device described in the above embodiments.

The invention is not limited to the above described embodiments, and may be modified into various forms without departing from the spirit and scope of the invention as described in the appended claims and specification. The scope of the invention also encompasses the thus modified electro-optical device, a method of manufacturing the same, and an electronic apparatus provided with the electro-optical device.

What is claimed is:

1. An electro-optical device comprising:
   a substrate;
   a data line over the substrate;
   a scanning line over the substrate, the scanning line intersecting with the data line;
   a pixel electrode that is provided at a position corresponding to an intersection at which the data line and the scanning line intersect with each other;
   a semiconductor layer including:
      a channel region with a channel length along a direction in which the data line or the scanning line extends;
      a data line side source/drain region electrically connected to the data line;
      a pixel electrode side source/drain region electrically connected to the pixel electrode;
      a first junction region formed between the channel region and the data line side source/drain region; and
      a second junction region formed between the channel region and the pixel electrode side source/drain region;
   a first insulating film that is formed in an island shape so as to cover the first junction region;
   a second insulating film that is formed in an island shape so as to cover the second junction region; and
   a gate electrode that faces the channel region through the gate insulating film and that extends onto the first and second insulating films.

2. The electro-optical device according to claim 1, wherein, as viewed in plan on the substrate,
   the first insulating film is provided so as not to overlap at least portion of the data line side source/drain region,
   the second insulating film is provided so as not to overlap at least portion of the pixel electrode side source/drain region, and
   the gate electrode is extended so as to overlap at least portion of the data line side source/drain region and extended so as to overlap at least portion of the pixel electrode side source/drain region.

3. The electro-optical device according to claim 1, wherein the gate insulating film is formed not only in the channel region but also in regions that face the first and second junction regions as a base layer for the first and second insulating films.

4. The electro-optical device according to claim 1, wherein the gate insulating film is not formed in regions that face the first and second junction regions, and wherein the first and second insulating films each are thicker than the gate insulating film.

5. The electro-optical device according to claim 1, wherein the first and second insulating films are formed from the same film in the same layer.

6. The electro-optical device according to claim 1, wherein the first insulating film, as viewed in plan on the substrate, is formed so as to at least partially cover the data line side source/drain region in addition to the first junction region, and wherein the gate electrode is extended onto the first insulating film so as to cover the data line side source/drain region.

7. The electro-optical device according to claim 1, wherein the second insulating film, as viewed in plan on the substrate, is formed so as to at least partially cover the pixel electrode side source/drain region in addition to the second junction region, and wherein the gate electrode is extended onto the second insulating film so as to cover the pixel electrode side source/drain region.

8. The electro-optical device according to claim 1, wherein at least one of the first and second insulating films is arranged at a position that is spaced at a predetermined distance away from the channel region as viewed in plan on the substrate.

9. The electro-optical device according to claim 1, wherein at least one of the first and second insulating films is arranged so as to face the semiconductor layer through a nitride film.

10. The electro-optical device according to claim 1, wherein the second junction region, as viewed in plan on the substrate, is at least partially arranged in a crossover region at which the data line intersects with the scanning line.

11. The electro-optical device according to claim 1, wherein the second junction region is an LDD region.

12. An electronic apparatus comprising the electro-optical device according to claim 1.

* * * * *